United States Patent [19]
Viscor et al.

[11] Patent Number: 5,627,479
[45] Date of Patent: May 6, 1997

[54] METHOD AND APPARATUS FOR DETERMINING CHARACTERISTIC ELECTRICAL MATERIAL PARAMETERS OF SEMI-CONDUCTING MATERIALS

[75] Inventors: Petr Viscor, Espergærde; Jan Vedde, Birkerød, both of Denmark

[73] Assignee: Peter Viscor, Espergærde, Denmark

[21] Appl. No.: 446,857

[22] PCT Filed: Dec. 7, 1993

[86] PCT No.: PCT/DK93/00410

§ 371 Date: Sep. 1, 1995

§ 102(e) Date: Sep. 1, 1995

[87] PCT Pub. No.: WO94/14078

PCT Pub. Date: Jun. 23, 1994

[30] Foreign Application Priority Data

Dec. 7, 1992 [DK] Denmark ................... 1466/92

[51] Int. Cl.⁶ .................. G01R 27/26; G01R 31/26
[52] U.S. Cl. .................. 324/765; 29/593; 204/195; 324/663
[58] Field of Search .................. 324/765, 663; 29/174, 593, 620; 317/235; 204/195

[56] References Cited

U.S. PATENT DOCUMENTS

| | | | |
|---|---|---|---|
| 3,605,015 | 9/1971 | Copeland, III | 324/158 D |
| 4,028,207 | 6/1977 | Faktor et al. | 204/195 |
| 5,103,183 | 4/1992 | Klein et al. | 324/663 |

FOREIGN PATENT DOCUMENTS

| | | |
|---|---|---|
| 0477795A3 | 1/1992 | European Pat. Off. . |
| 0477795A2 | 1/1992 | European Pat. Off. . |
| 1589030 | 2/1970 | Germany . |
| 3103611A1 | 9/1982 | Germany . |
| 1319032 | 5/1973 | United Kingdom . |

OTHER PUBLICATIONS

Capacitance Measurement for ASIC QC; Electronic Engineering; Jun. 1987; pp. 14, 19.

Use of Impedance Meters in Dielectric Measurements; Solodukha Et Al.; Plenum Publishing Corporation; 1983; pp. 521–522.

*Primary Examiner*—Kenneth A. Wieder
*Assistant Examiner*—Barry C. Bowser
*Attorney, Agent, or Firm*—Watson Cole Stevens Davis PLLC

[57] ABSTRACT

The present invention relates to a method for determining characteristic electrical properties of semi-conducting materials wherein the time/frequency dependent electrical impedance or admittance of the material is measured. The invention also relates to an apparatus for carrying out the method. A number of bulb and surface parameters characterize the electrical properties of a given piece of material. These parameters include the dielectric constant $\epsilon$ of the material, the difference $\Delta\mu_{ch}$ in the chemical potential of the bulk of a material and the chemical potential of its surface and/or metal electrode—material surface interface, the density of the majority and minority electrical mobile charge carriers N and $N_{min}$, respectively, in the bulk of the material, the electrical mobility $\mu$ of the majority electrical mobile charges in the bulk of the material and the electrical mobility $\mu_{min}$ of minority mobile charge carriers, the surface and bulk emission and capture rates E.R. and C.R., respectively, for mobile positive and negative charge carriers characterizing the effect of surface and bulk localized states within the band gap, when they are present, on the electrical transport.

12 Claims, 12 Drawing Sheets

METHOD AND APPARATUS FOR DETERMINING CHARACTERISTIC ELECTRICAL MATERIAL PARAMETERS OF SEMI-CONDUCTING MATERIALS

The present invention relates to a method for determining characteristic electrical properties of semi-conducting materials wherein the time or frequency dependent electrical impedance or admittance is measured. The invention also relates to an apparatus for carrying out the method.

A number of bulk and surface parameters characterize the electrical properties of a given piece of material. These parameters include the dielectric constant $\epsilon$ of the material, the difference $\Delta\mu^{ch}$ in the chemical potential of the bulk of a material and the chemical potential of its surface and/or of metal electrode—material surface interface, the density of the majority and minority electrical mobile charge carriers N and $N_{min}$, respectively, in the bulk of the material, the electrical mobility $\mu$ of the majority electrical mobile charges in the bulk of the material and the electrical mobility $\mu_{min}$ of minority mobile charge carriers, the surface and bulk emission and capture rates E.R and C.R., respectively, for mobile positive and negative charge carriers characterizing the effect of surface and bulk localized states within the band gap, when they are present, on the electrical transport.

Depending on the experimental arrangement the present invention can be used either to characterize the whole piece of material (integral characterization), or alternatively to map the variations of the above mentioned electrical material parameters, i.e. some of them, all of them and/or various combinations of them such as the specific resistivity $\rho$: $1/N.e.\mu$ as a function of the position of the measuring head and measuring point on the surface of the material be that a piece of semi-conductor, insulator or a semi-conducting wafer.

There exists a number of experimental methods today that are being used for the experimental determination of the above mentioned electrical material parameters $\Delta\mu^{ch}$, $\epsilon$, N and $\mu$, in semi-conductors and insulators. Table 1 illustrates to the best knowledge of the inventors the range of the experimental methods (the list not being exhaustive) that are relevant to the present invention.

The literature about each of these experimental methods is vast. The references (1), (2) and (3) relate to Standard Electrical Impedance Experimental method and have been chosen as sufficient background reference since the present invention relates directly to this particular experimental method.

The known experimental methods used today for the determination of the parameters suffer from a number of disadvantages the main of which can be summarized as follows:

a) None of the existing experimental methods is capable of determining all of the parameters simultaneously and independently in a single experiment.

b) A combination of two different experimental methods is often required in order to be able to determine some of the parameters in question, for example a combination of the Hall effect and the d.c. four probe resistivity measurements is required if both $\mu$ and N are to be obtained.

c) Determination of some of the parameters in question is often very indirect. The determination of $\Delta\mu^{ch}$ by Photoemission, for example, is measured in two steps. First the work function of the un-contacted surface of the material is measured and then the measurement of the work function of the contacting metal is performed. The difference between the two work functions is then assumed to be a measure of the $\Delta\mu^{ch}$ when the material in question is contacted by the given metal.

d) The experimental methods in question are often very expensive to establish (PEE,FTIR, FTIPL), requiring either an ultra high vacuum environment (CP,TEE, PEE), liquid Helium temperatures (FTIR, FTIPL) or magnetic fields (HE).

e) Because of the very nature of the experimental arrangements the existing methods can often be considered only as qualitative in relation to the determination of the numerical values of the parameters in question.

f) All the electrical experimental methods named in Table 1 (Standard EIS, 4PDCR, HE and TOF) either neglect totally or treat inadequately the effects of the electrical contact regions, the effects of the real surfaces of the material under investigation (surfaces that are part of the electrical measuring circuit), the effects of the metal electrode—material surface regions and the effects of the depletion regions within the material under investigation on the calculated values of the parameters in question. This neglect renders them unusable for the characterization of higher resistivity materials ($\rho \geq 100$ $\Omega$·cm) and introduces relatively large errors even for characterization of materials with resistivities in the region $1.0 < \rho < 100$ $\Omega$·cm (averaging of the effect of electrical contacts, depletion regions and bulk).

Among other experimental methods (not displayed in Table 1) used today for the characterization of semiconductors there are two that are relevant as far as the present invention is concerned (see EP-A-0477795, DE-A-3103611, U.S. Pat. No. 5,103,183 and U.S. Pat. No. 4,028,207) and which should therefore be mentioned.

These are the C-V and DLTS experimental methods and variations thereof aiming at the determination of either the doping density and/or doping density profiles (C-V) or at the characterization of the deep levels in semiconductors (DLTS).

The measured quantity in both methods is an appropriate capacitance and its variation with external d.c. voltage bias (C-V) or temperature (DLTS).

The major drawback of both is that the measuring frequency at which the wanted capacitance is measured is chosen arbitrarily. This fact often renders them unusable.

The proper analysis of the electrical responses embodied in the present invention is essential in deciding on their validity. This prior art in comparison with the present invention is discussed in more detail at the end of this specification.

The above drawbacks of the prior art are eliminated by the method according to the present invention which is characterized by the step of establishing a finite, positive (n-type) or negative (p-type) difference in the chemical potential between the inner and the surface of the material or between the inner of the material and the metal electrode—material surface interface layer, thereby causing the formation of depletion regions near the electrical contacts, and by using the effect of this established difference in the chemical potential on the measured electrical impedance or admittance, the step of determining from this measured electrical impedance or admittance one, more or all of the following electrical parameters of the material:

the difference $\Delta\mu^{ch}$ in chemical potential, the dielectric constant $\epsilon$, the density N of majority mobile charge carriers, the density $N_{min}$ of minority mobile charge carriers, the electrical mobility $\mu$ of majority mobile charge carriers, the electrical mobility $\mu_{min}$ of minority mobile charge carriers, the emission and capture rates E.R. and C.R., respectively, for mobile positive and negative charge carriers characterizing the effect of surface and bulk localized states within the bind gap Eg, when they are present, on the electrical transport and the measured electrical impedance, whereby the determination of the electrical parameters of the material is carried out by solving a system of equations for the total charge density $\rho(x,t)$ consisting of the mobile negative and positive charge densities and localized negative and positive charge densities in the material supplemented with initial and boundary conditions, where the space-time development of $\rho(x,t)$ determines the electric current running in the external circuit in responce to the applied electric voltage thereby defining the electrical complex impedance $\tilde{Z}_s(\omega)$ of the material.

One of the essential aspects of the present invention is the realization that the electrical characteristics of the surfaces of the material and/or of metal electrode-surface interfaces, and the depletion regions within the material and of the bulk region of the material are all interrelated in a calculable fashion that depends on the values of the electrical material parameters $\Delta\mu^{ch}$, $\epsilon$, N, $\mu$, E.R. and C.R. that characterize the material electrically. Therefore by including all these regions in the analysis of the measurement of the electrical response of the material using for example Standard EIS experimental method that leads to the determination of the complex electrical impedance $\tilde{Z}(\omega)$ of the material, the electrical material parameters of the material can be determined unambiguously and simultaneously in one and the same measurement and analysis process.

In other words the electrical characteristics of the electrical contacts, the depletion regions and the bulk of the material are all determined by a few fundamental physical parameters that characterize the electrical properties of a given piece of material—be that semiconductor single crystal ingot, a piece of polycrystalline semiconductor, semiconductor wafer or a piece of insulating material.

Contrary to all the relevant existing electrical experimental methods used today for similar type of measurements—methods that either neglect, average and/or treat inadequately the effects of electrical contacts and depletion regions on the resulting measured electrical characteristics and which in their experimental arrangement all aim to achieve "good" ohmic contacts (the effect of the electrical contacts and depletion regions being small and therefore often neglectable)—the present invention is based precisely on the opposite requirement, namely the requirement of establishing nonohmic ("bad") electrical contacts, where the electrical characteristics of the electrical contacts and depletion regions are apparent and are therefore easily measurable.

The experimentally observable quantity in question that contains all the necessary information from which the calculation of the electrical material parameters is possible is the above mentioned complex electrical impedance $\tilde{Z}(\omega)$.

To fulfil the requirement of non-ohmic electrical contacts and the requirement of the possibility of a quantitative determination of the electrical material parameters, a number of necessary steps has to be taken including the definition of the sample (the piece of the material under investigation subjected to a measurement geometry) and establishment of the necessary conditions for the existence of the depletion regions within the sample.

The present invention therefore relates to a method consisting of a number of stages. These are:

1. Sample preparation
Definition of the $\Delta\mu^{ch}$ for the sample
2. Experimental arrangement
Definition of the sample geometry in the given electrical measurement circuit
3. Method of measurement
Definition of the method to measure the electrical response of the sample
4. Method of analysis
Calculation of the electrical material parameters that characterize the electrical properties of the sample.

The method according to the present invention will be somewhat different in the two basic applications envisaged. These applications are named here as "research" and "on—line quality control" configurations, each being characterized by somewhat different content of the steps of the present invention. The principle of the present invention is though the same in both these configurations.

The "research" application of the present invention involves more detailed studies of the electrical material parameters for example as functions of temperature, pressure, heat treatment, electrical d.c. voltage bias, optical excitation etc.

This type of studies require a proper treatment of the active surface of the material, deposition of the appropriate metal electrodes on such prepared surfaces and the experimental environment (arrangement) that fulfils the above mentioned requirements concerning the external parameters, such as temperature, pressure etc. If an x,y mapping is required, this will be done destructively by cutting a given piece of material (semiconductor wafer) into a number of elements (x,y) and measuring these sequentially.

The "on-line quality control" application of the present invention on the other hand is intended for the quality control (integral or x,y mapping) of semiconductor wafers. The electrical contacts at a given x,y position have to be made quickly (non-destructively) and after the measurement the measuring head (point) has to move reasonably quickly to a new x,y position, so that x,y mapping of the wafer of one or more of the electrical material parameters can be made reliably and fast and with sufficient throughput (number of wafers processed in unit of time). This application of the present invention therefore involves no or very little sample preparation (production wafers) and fast, automated sample exchange mechanism together with x,y scanning of the measuring head across the surface of the wafer.

The apparatus for carrying out the method comprises an external electrical circuit for measuring the time or frequency dependent electrical impedance or admittance of the material and means for electrically contacting the surface or surfaces of the material and the apparatus is characterized by means for providing a finite, positive (n-type) or negative (p-type) difference in the chemical potential between the inner and the surface of the material or between the inner of the material and the metal electrode—material surface interface layer, thereby causing the formation of depletion regions near the electrical contacts, and means for determining from the measured electrical impedance or admittance one, more or all of the following electrical parameters of the material:

the difference $\Delta\mu^{ch}$ in chemical potential, the dielectric constant $\epsilon$, the density N of majority mobile charge carriers, the density of $N_{min}$ of minority mobile charge carriers, the electrical mobility μ of majority mobile charge carriers, the electrical mobility $\mu_{min}$ of minority mobile charge carriers, the emission and capture rates E.R and C.R., respectively, of mobile positive and negative charge carriers characterizing the effect of surface and bulk localized states within the band gap Eg, when they are present, on the electrical transport and the measured electrical impedance.

The invention will now be described in more details with reference to the drawings in which FIG. 1 is a schematic diagram of the one-electron energy levels in the bulk of the material, at the surface of the material and in the metal electrode that are relevant to the present invention. (Definition of the $\Delta\mu^{ch}$)

FIG. 2a, 2b, 2c are schematic diagrams of possible capacitive couplings between the material and the external electrical field (external electrical metal electrodes) that may be utilized to implement the present invention.

2a) "Research" configuration ("sandwich" capacitive coupling)

2b) "on-line quality control" configuration ("sandwich" capacitive coupling)

2c) "Research" and/or "on-line quality control" configurations ("planar" capacitive coupling) (Definition of the sample geometry)

6a) The logarithm of the real part of the electrical impedance Z (ω) versus logarithm of the measuring frequency ω, 6b) The logarithm of C (imaginary part of the electrical admittance Y(ω) divided by (ω) versus logarithm of measuring frequency ω. (Results—example 1)

Figure 7A:
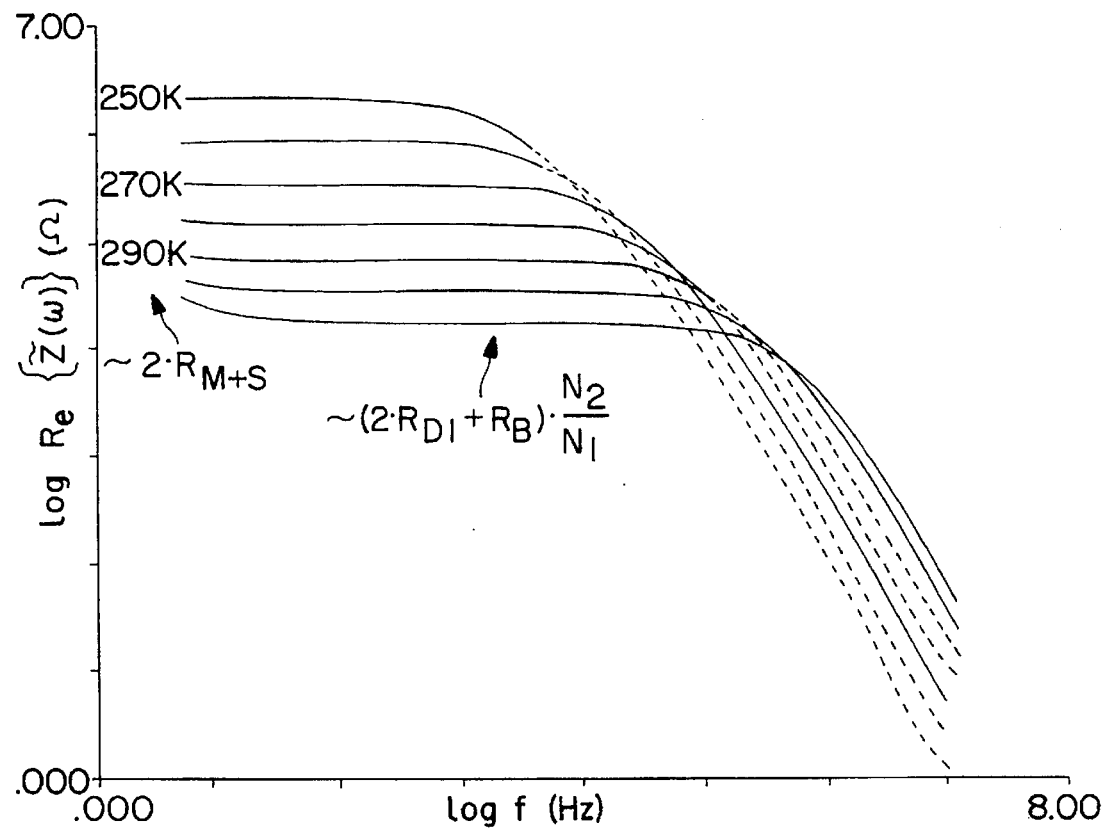
Figure 7B:
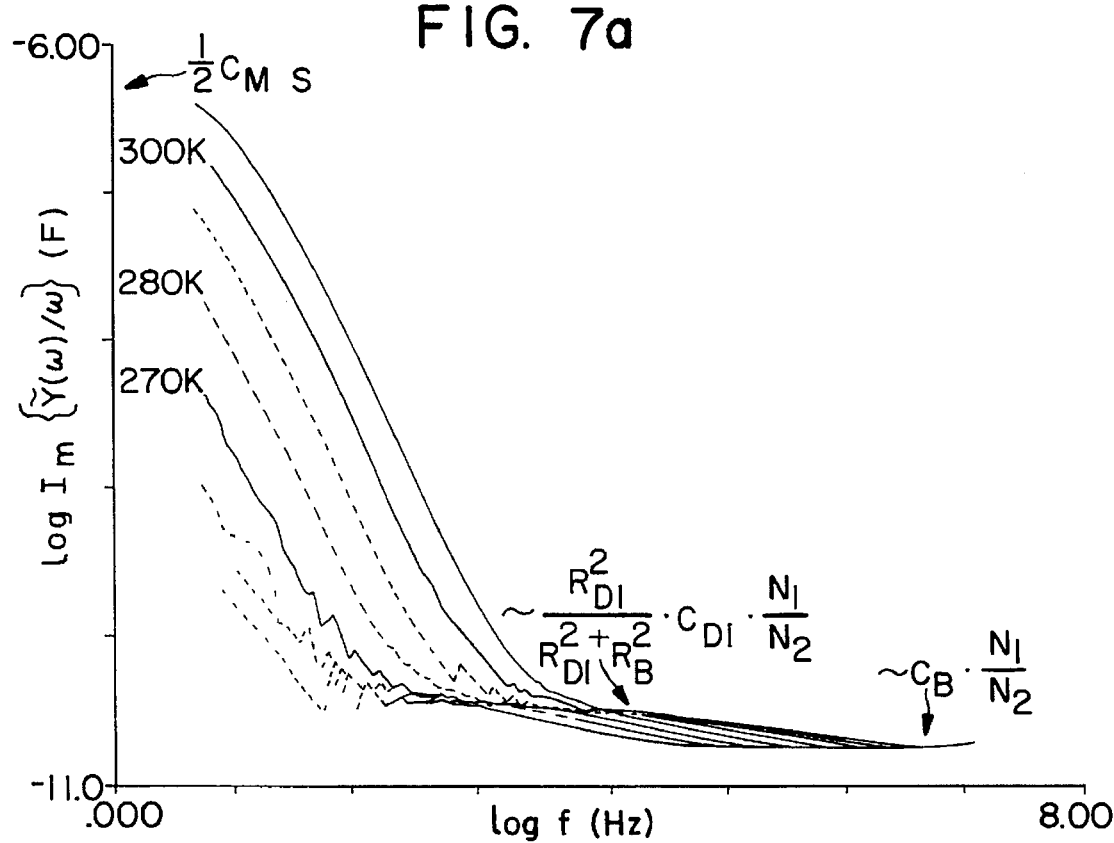

FIG. 7a, 7b show Example 2; the experimentally observed electrical response of the sample 2 (pure, polycrystalline silicon, unknown type, unknown N) (ω=2π·f)

7a) The logarithm of the real part of the electrical impedance Z (ω) versus logarithm of the measuring frequency ω.

7b) The logarithm of C(ω) (imaginary part of the electrical admittance Y(ω) divided by ω) versus logarithm of the measuring frequency ω. (Results—example 2)

Figure 8A:
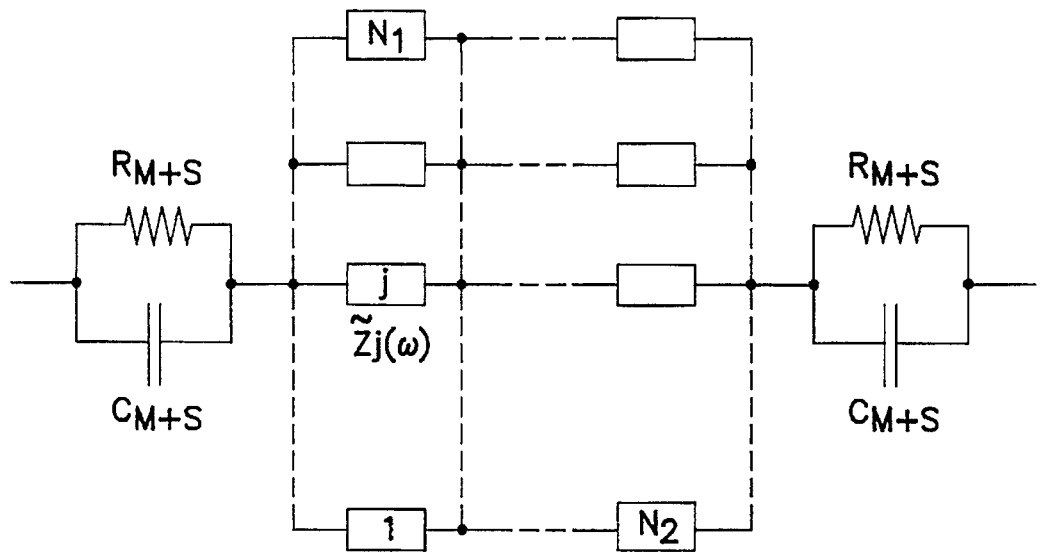
Figure 8B:
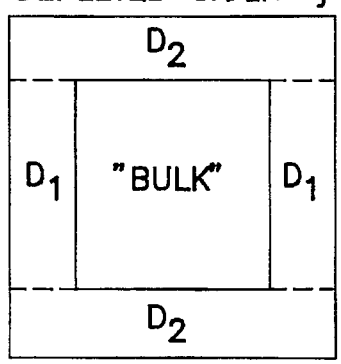
Figure 8C:
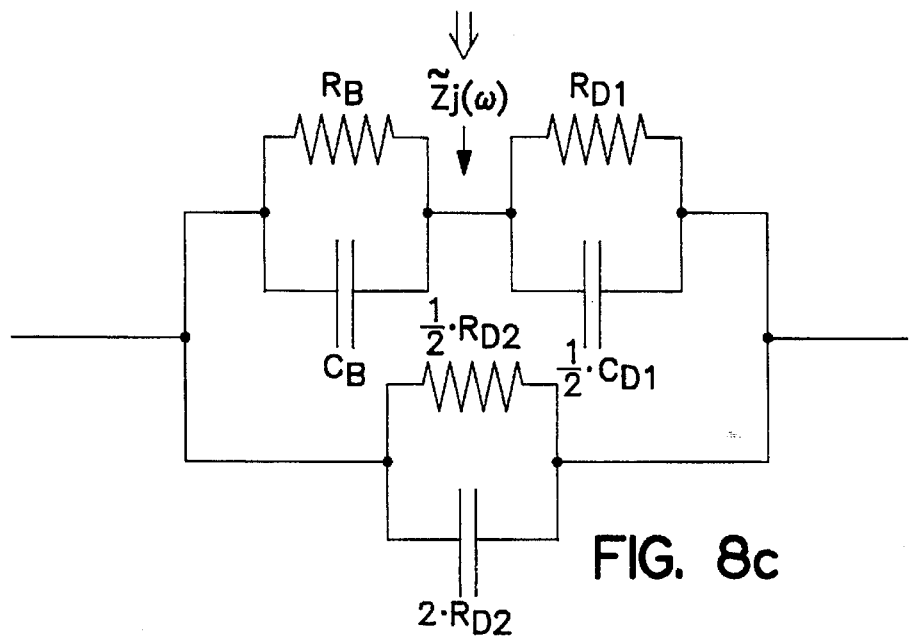

FIG. 8a, 8b, 8c The theoretical analysis of the electrical response of the pure, polycrystalline silicon sample (Example 2)

8a) A topological model of polycrystalline silicon sample consisting of $N_1 \times N_2$ grains, each grain being characterized by its electrical impedance $Z_j(\omega)$. The shown passive, static R,C electrical network representing the total electrical response includes also metal-semiconductor interface region represented by $R_{M+S}$, $C_{M+S}$ elements.

8b) A simplified physical model of depleted grain "j".

8c) Static R,C electrical network representing the electrical response of a single grain.

The present invention is not limited to any particular apparatus, sample preparation and measurement method but may be carried out by a variety of different steps (method stages).

In which follows the individual stages

1) Sample preparation (definition of the $\Delta\mu^{ch}$ for a given material (sample))

2) Experimental arrangement (definition of the sample geometry within the given electrical measurement circuit)

3) Method of measurement (measurement of the electrical response)

4) Method of analysis (calculation of the electrical material parameters $\Delta\mu^{ch}$, ε, N and μ (here also all possible combinations of these) by using various analytic expressions for parts or the whole of the measured $\tilde{Z}$ (ω) function or by using the numerical solutions of the governing equations with the electrical material parameters as free fitting parameters will be described in detail using FIGS. 1 to 5. The new method for electrical characterization of semiconducting/insulating materials will be demonstrated on a couple of examples shown in FIGS. 6 to 8.

Finally Table 2 illustrates the quantitative results for the values of $\Delta\mu^{ch}$, ε, N and μ on a number of monocrystalline silicon samples of both n and p-type with various degrees of doping, obtained by the use of the present invention and compared with the values for these parameters obtained by other methods on the same samples and from Physics tables (4) and the literature.

STAGE 1

Sample Preparation (definition of $\Delta\mu^{ch} = \mu^{ch}_B - \mu^{ch}_{M+S}$ of the material)

Figure 1A:
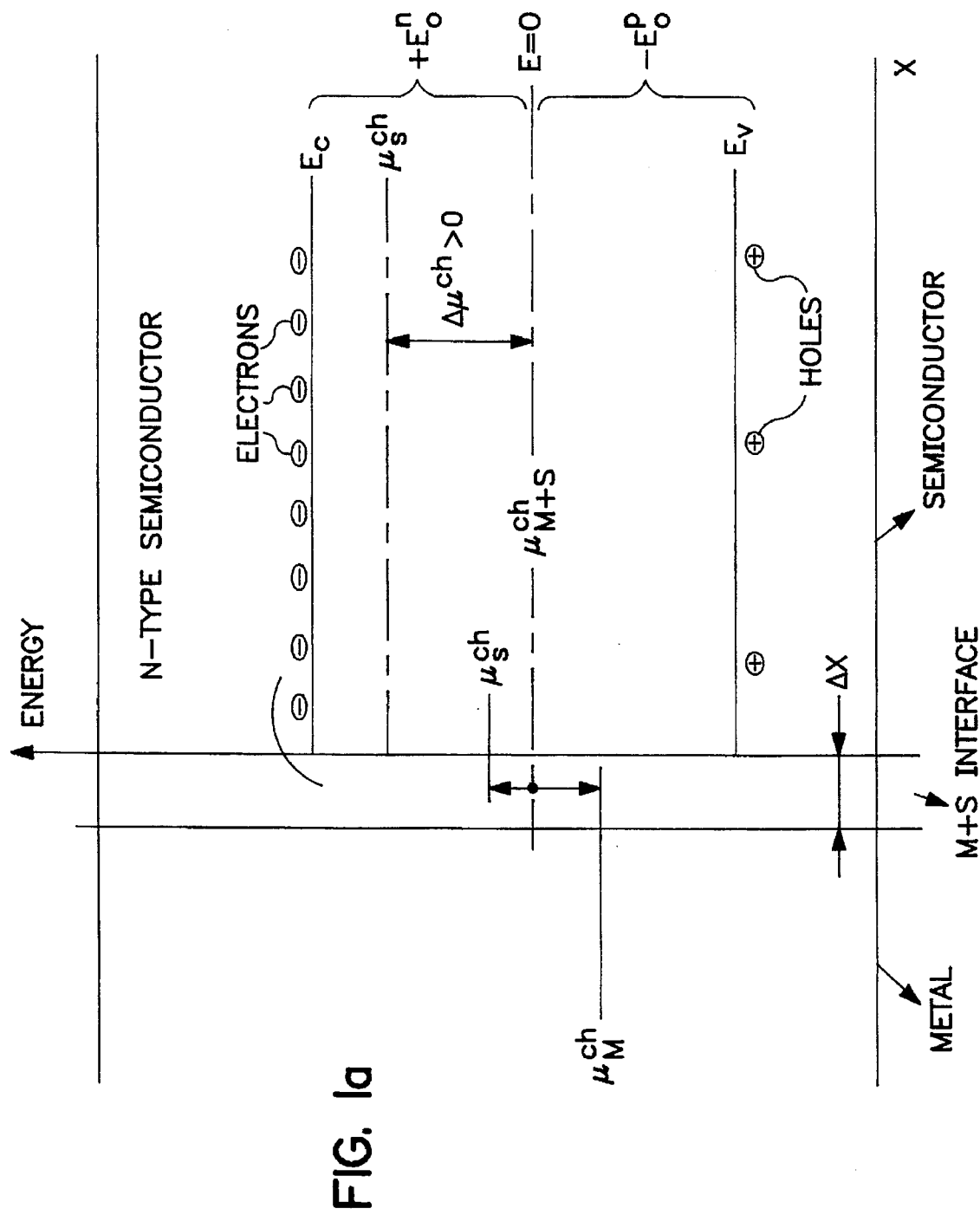
Figure 1B:
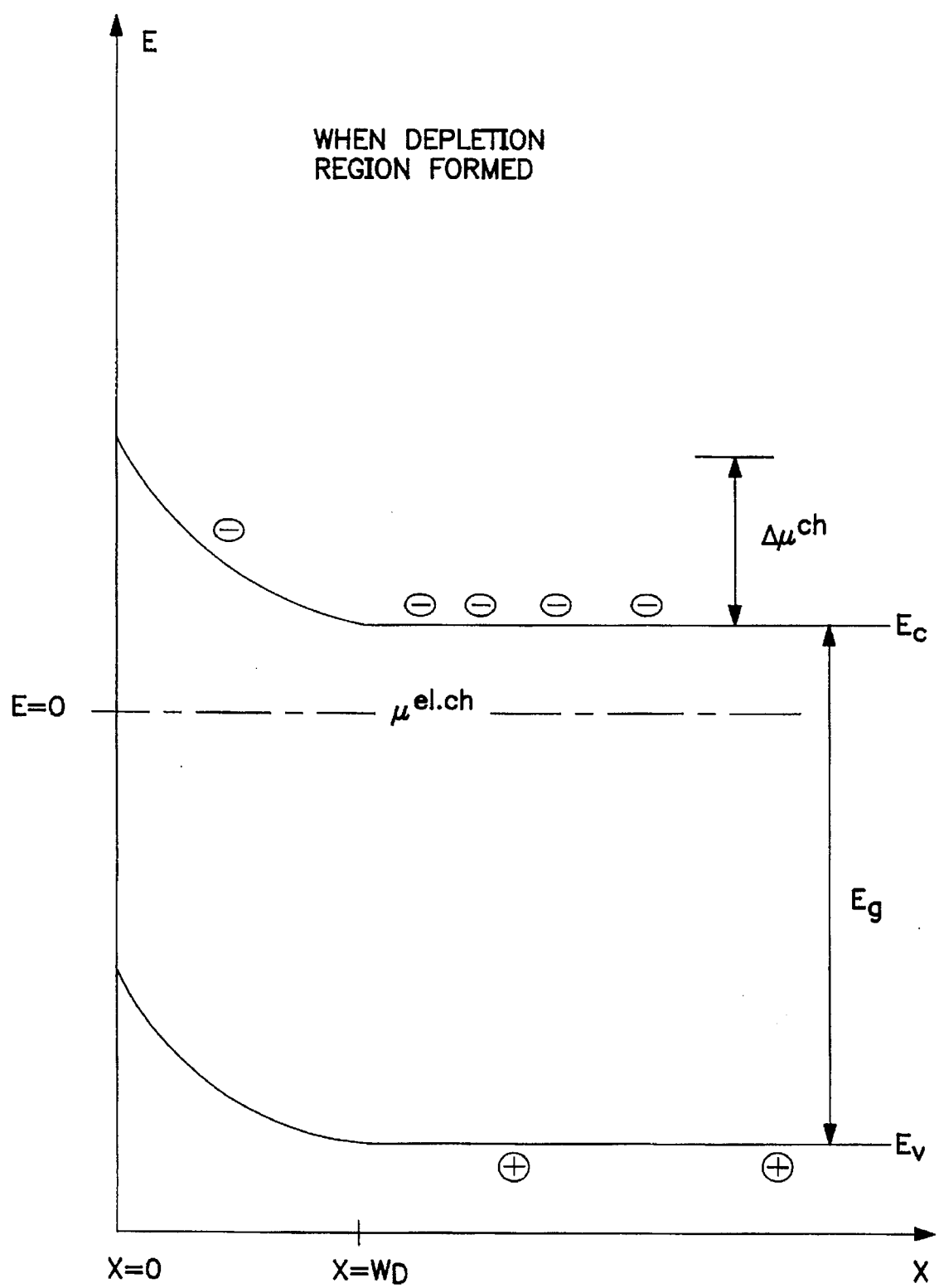
Figure 2A:
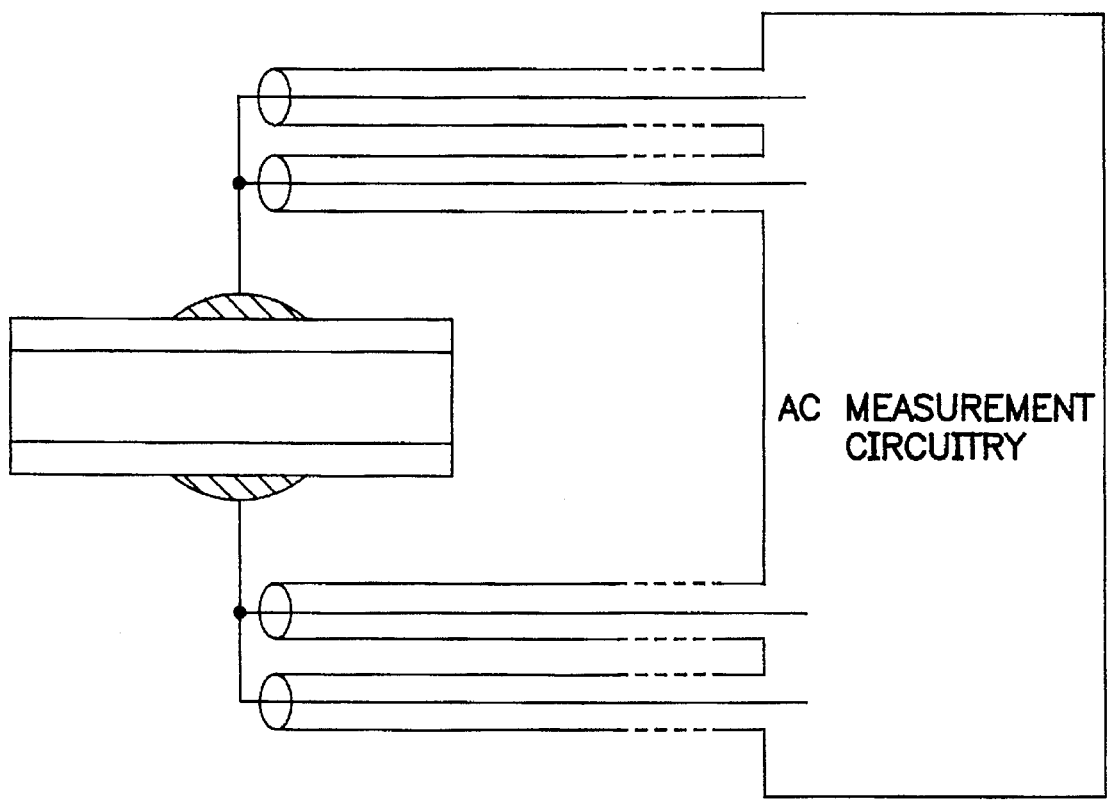
FIG. 2d, 2e are schematic diagrams showing the geometrical dimensions of the material under investigation 2d) "Research" configuration 2e) "on-line quality control" configuration (Definition of the sample geometry)

In order to achieve the first requirement (establishment of the condition $\Delta\mu^{ch}>0$ for n-type and $\Delta\mu^{ch}<0$ for p-type material, respectively) reference is made to FIG. 1 for a sample sandwiched between two metal electrodes in a preferred geometric configuration depicted in FIG. 2a (a simple capacitor configuration). The problem in this case is quasi one-dimensional (area $A_r$ of the sample is constant and its linear dimension $\sqrt{A}$ is large compared with the length of the sample L).

Referring to FIG. 1 the sample of the finite length L extends from x=0 to x=L, x=0 and x=L planes being the true surfaces of the sample. The metal electrodes are deposited $\Delta x \rightarrow 0$ (or applied $\Delta x > 0$) on both these surfaces (capacitive coupling of the sample to the external field) and when an external electrical voltage is applied between these two electrodes an external electrical field is created within the volume of the sample.

With no external electrical voltage applied the average energy of the mobile electrical charges well within the bulk of the sample is characterized by the thermodynamical quantity $\mu_B{}^{ch}$—chemical potential of the bulk. The average energy of the electrical charges at the surface of the sample (and/or of sample surface-metal electrode interface) is characterized by the sample surface-metal electrode interface chemical potential $\mu^{ch}{}_{M+S}$.

Considering the n-type material first there will be an outflow (inflow) of the mobile electrical charges from (into) the sample to (from) sample surface-metal electrode interface region depending on whether the chemical potential $\mu_B{}^{ch}$ of the bulk of the sample lies above (below) the value of the chemical potential of the sample surface-metal electrode interface region $\mu^{ch}{}_{M+S}$.

This flow of the mobile electrical charges from the sample interior (sample exterior) creates an internal electrical field in the regions near the surfaces of the sample that eventually stops any further flow. In this way a dynamical thermodynamical equilibrium is established that is characterized by the existence of the depletion regions (outflow of the mobile electrical charges from the interior of the sample into the sample surface-metal electrode interface region or accumulation reqions (inflow of the mobile electrical charges from the sample surface-metal electrode interface region into the interior of the sample).

The requirement of the Stage 1 of the present invention ($\Delta\mu^{ch}>0$ (n-type material), $\Delta\mu^{ch}<0$ (p-type material)) is simply the requirement for establishing (securing the existence of) the depletion regions in the material by securing that for the n-type material $\mu^{ch}{}_B>\mu^{ch}{}_{M+S}$ (the same arguments apply for the p-type material but here the condition $\mu^{ch}{}_{M+S}>\mu^{ch}{}_B$).

If the condition $\mu^{ch}{}_B>\mu^{ch}{}_{M+S}$ (n-type material) or $\mu^{ch}{}_{M+S}>\mu^{ch}{}_B$ (p-type material) are not satisfied then an appropriate treatment of the sample surface might be necessary. This applies in cases where $\mu^{ch}{}_{M+S}$ is determined mainly by the surface states of the material. Alternatively an adequate metal electrode—with the right value of the work function—has to be chosen. This applies in cases where $\mu^{ch}{}_{M+S}$ is determined mainly by the work function of the metal electrode. In general a combination of both processes might be required.

Both of these preparation processes or steps move the value of $\mu^{ch}{}_{M+S}$ up or down on the energy scale (see FIG. 1) so that the condition $\Delta\mu^{ch}>0$ can be eventually obtained for n-type and p-type materials ($\Delta\mu^{ch}<0$).

Although a specific description of the Stage 1 has just been given, it is clear to anyone experienced in the field that other ways of securing the condition $\Delta\mu^{ch}>0$ might be possible.

The Stage 1 of the present invention therefore does not relate to any particular process or sequence of processes how to achieve the condition $\Delta\mu^{ch}>0$ but it is simply embodied in the condition itself—establishment of the $\Delta\mu^{ch}>0$ for n-type material and $\Delta\mu^{ch}<0$ for p-type material.

STAGE 2

Experimental Arrangement (definition of the sample geometry, of the sample environment and of the electrical measurement circuit) Experimental arrangement that constitutes the Stage 2 of the present invention is defined in three steps. The first is sample—metal electrodes configuration, the second is definition of the sample geometry in a given sample - metal electrode configuration and the third step defines the sample environment together with electrical connections to the external electrical measurement circuit. These steps will now be described in more detail.

Sample—metal electrodes configuration defines the way the external electrical field is coupled to the piece of the material under investigation. This can be done in a variety of ways in principle but in the preferred embodiment (preferred experimental arrangement) a most simple capacitive coupling is preferred where the material and the electrodes form a simple capacitor.

In this configuration, known also as "sandwich configuration", the electrical field profile within the sample is simple, making the definition of the sample geometry in the electrical measurement circuit easy and precise.

Two basic preferred configurations are considered. They are both shown in FIGS. 2a and 2b.

In the "research" configuration (FIG. 2a) the appropriate metal electrodes are deposited directly onto both surfaces of the material ($\Delta x \rightarrow 0$ in FIG. 1) minimizing the "edge" effects of this simple capacitor (no corrections for the "edge" effects in the calculation of the sample geometry is needed).

In the "on-line quality control" configuration (FIG. 2b) the major requirement is that the electrodes can be applied at a particular measurement point $P_1$ $(x_1,Y_1)$ of the semiconductor wafer surface and after the measurement of the electrical response is completed at this point the electrodes can be re-applied at a new point $P_2(x_2,y_2)$ with a new measurement of the electrical response to follow. The process is repeated for all the points $P_i(x_i,y_i)$ of the wafer surface. The effective electrode area (including the "edge" effects) is required to be the same through-out the whole of the mapping measurement process (measurement of the electrical response across the whole area of the wafer).

Figure 2B:
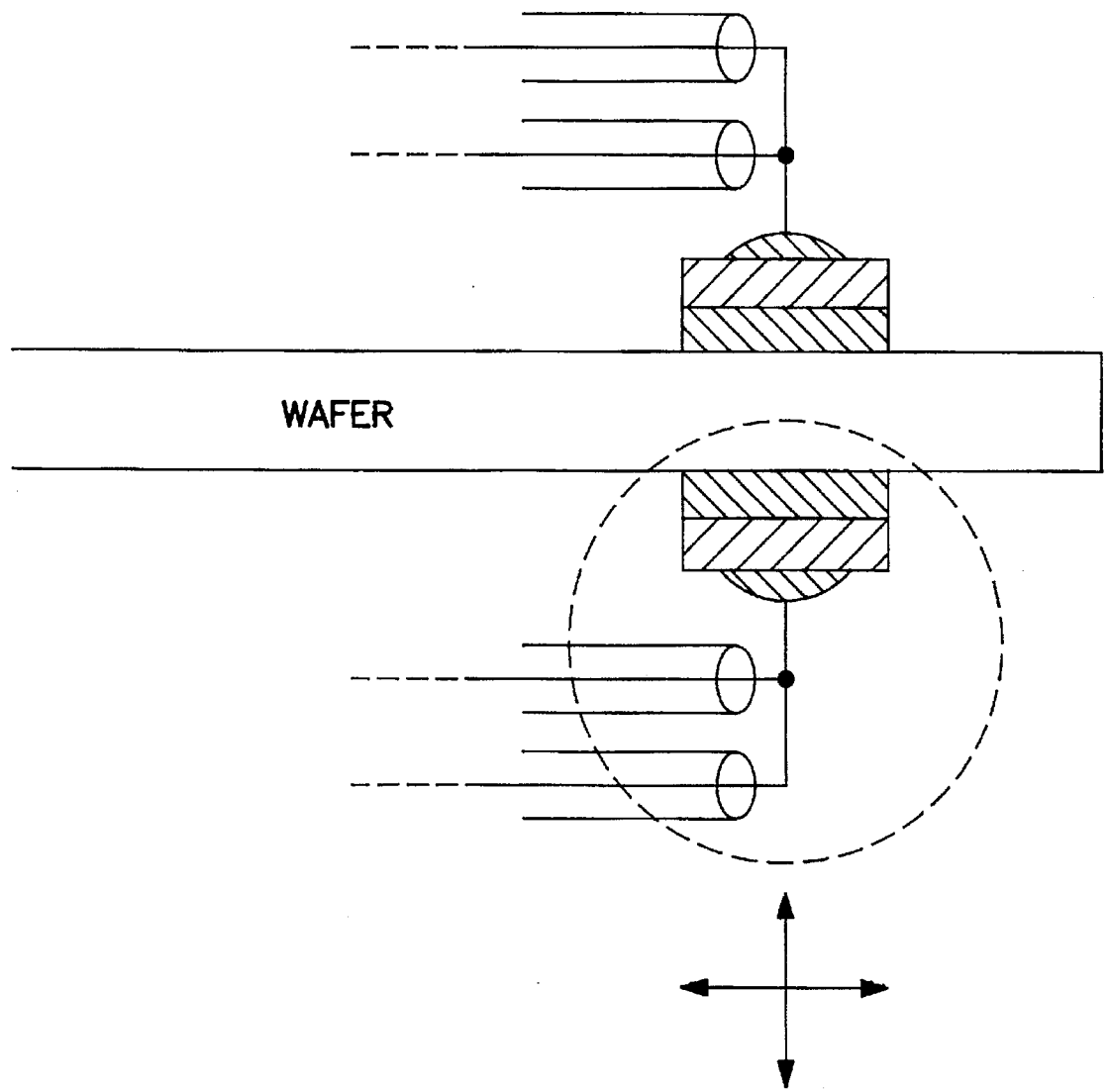
Figure 2C:
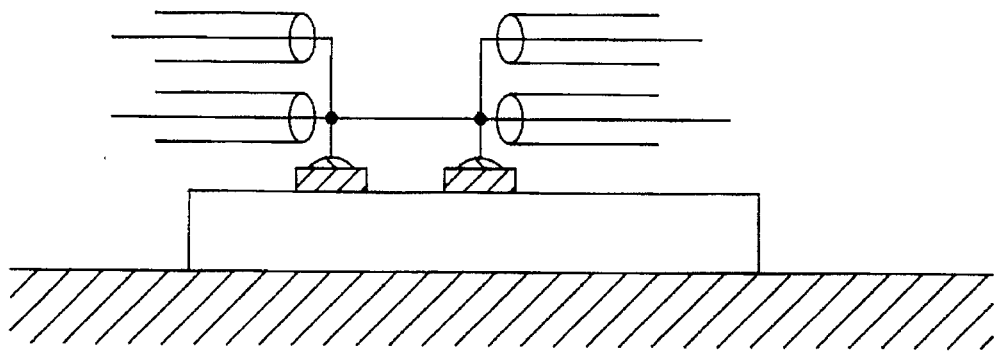

Another possible sample—electrode configuration is shown in FIG. 2c. This type of configuration—an "open capacitor" configuration (also known as "planar" configuration) might be relevant for the measurements on thin films and/or semiconducting/insulating bulk materials (here also wafers) where a simple capacitor configuration is not possible. The preferred shape of the electrodes in this case will be rectangular with well defined gap between them.

In all the configurations described above the geometrical shape of the electrodes is not important but must be known together with the corresponding external electrical field profile.

Sample Geometry

In a given sample—electrode configuration, either a preferred embodiment—FIG. 2a and 2b or any modification thereof such as shown for example in FIG. 2c, the next step in Stage 2 of the present invention consists of the determination of the geometrical dimensions of the system sample+metal electrodes that are relevant for the definition of the given configuration as a electrical element within the electrical measurement circuit. The quantities in question are the areas and the lengths (thicknesses) of the individual elements comprising the sample—electrode configuration.

Figure 2D:
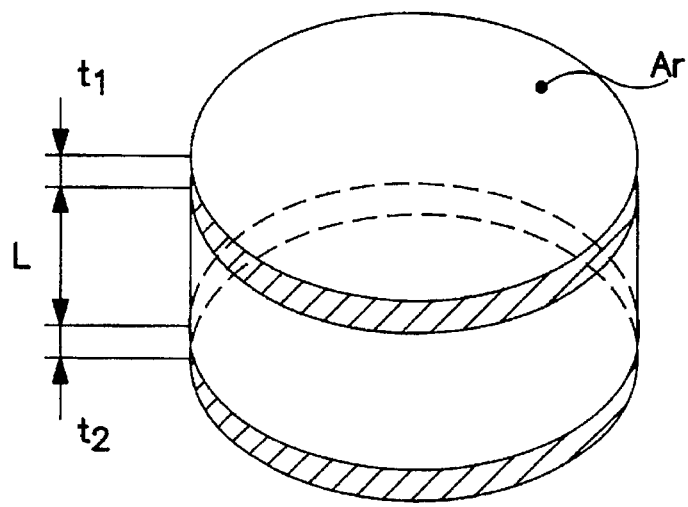

Referring to FIG. 2d (the "research" configuration), the elements of the configuration are the top metal electrode (of area $A_r$ and length $t_1$), the piece of the material under investigation (of area $A_r$ and length L) and the bottom metal electrode (of area $A_r$ and length t2). If the electrical resistance of the metal electrodes is low (low compared to the resistance of the piece of the material under investigation), the effect of the metal electrode elements on the electrical response can be (safely) neglected and the geometrical dimensions of the sample—electrode configuration is that of the sample itself (area $A_r$ and the length L).

Figure 2E:
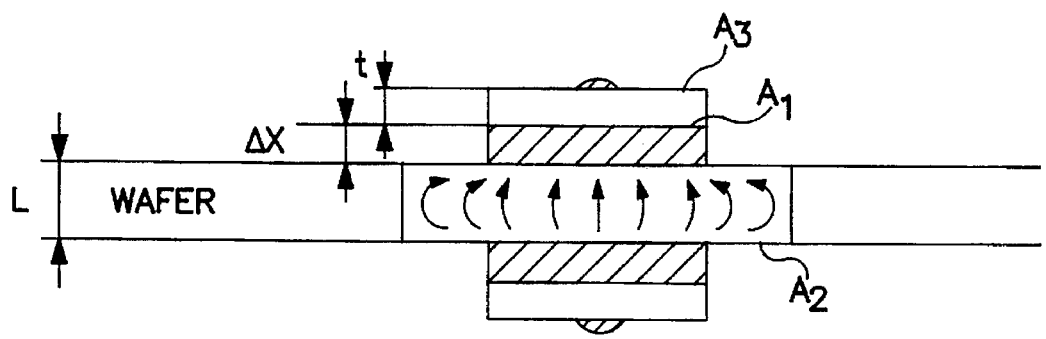

In the "on-line quality control" configuration shown in FIG. 2e the same arguments apply and the relevant elements (with their geometrical dimensions) are the contacting conductive medium (of area $A_1$ and the length $\Delta x$; in the preferred embodiment of the present invention these quantities are the same for both electrical contacts), the piece of the material under investigation (of the effective area $A_2$ (inclusive the "edge" effects) and the length L) and the top and bottom metal electrodes (both of the area $A_3$ and the length t).

All these quantities have to be measured with a sufficient precision prior to calculation of the four electrical material parameters $\Delta\mu^{ch}$, $\epsilon$, N and $\mu$ since the relative errors in their measurement determines the overall accuracy with which the numerical values of the above mentioned four electrical material parameters can be obtained using the present invention.

Sample environment and electrical contacts

Two basic sample environments are envisaged in the preferred embodiment of the present invention.

In the "research" configuration the sample (FIG. 2d) is placed in the cryostat, so that the dependence of the four electrical material parameters $\Delta\mu^{ch}$, $\epsilon$, N and $\mu$ can be studied as function of temperature, pressure, d.c. electrical bias, optical (particle) excitation of the electrical charges within the material under investigation etc.

In the "on-line quality control" configuration, the sample (a semiconductor wafer—see FIG. 2e) is placed preferably in a automatic wafer exchange mechanism that introduces one wafer at a time into a dark (optically) measurement compartment, where x,y mapping of the four electrical material parameters takes place at room temperature, the whole assembly making the large throughput (number of wafers processed in a unit of time) possible. Other sample environments are evidently also possible and this step of the Stage 2 of the present invention does not therefore relate to any particular sample environment but only demands that the sample environment be well known (temperature of the sample, definition of the "optically" dark measurement compartment etc.).

Once placed in its appropriate environment the sample has to be connected via electrical leads to the external measurement circuit. In the preferred embodiment of the present invention this is achieved best by connecting four screened coaxial lines (two and two connected together at the sample—see FIGS. 2a–2c) to each of the sample surfaces (each of the sample electrodes), minimizing in this way the unwanted effects of the external leads (the self-induction and the stray capacitances of the electrical leads) on the measured electrical response of the sample. Two of the leads (one from each side of the sample) are used to measure the electrical voltage across the sample while the other two leads are used to measure the electrical current through the sample. The other ends of the four coaxial lines are then connected to the external electrical measurement circuit.

Other possible ways of connecting the sample to the external electrical measurement circuit exist evidently also.

This step of the Stage 2 of the present invention (electrical contacts to the sample) does not relate to any particular way of connecting the sample to the external electrical measurement circuit but resides (is embodied) in the requirement that the effect of the external electrical leads to the sample in the alternatives (modifications) to the preferred embodiment (FIG. 2a and FIG. 2b) must be known and properly accounted for in the final analysis of the electrical response of the whole system, the system being defined as consisting of the sample, the electrodes and the electrical leads.

Stage 3

Method of Measurement (definition of the measurement method)

There exists a number of possible ways of measuring the electrical response of a system (sample, electrical metal contacts and external electrical leads) involving either real time and/or frequency domain. All these experimental methods involve a measurement of the two relevant quantities— input signal (be that electrical charge, electrical voltage or electrical current) and the—output signal (complementary quantity to the input), the ratio between the output and the input defining the appropriate electrical response function. Two forms of the input signal are used most commonly. These are the "step" or "sinusoidal" input. The respective electrical response functions of these two input forms are related to each other through Laplace transform (linear response regime).

Figure 3:
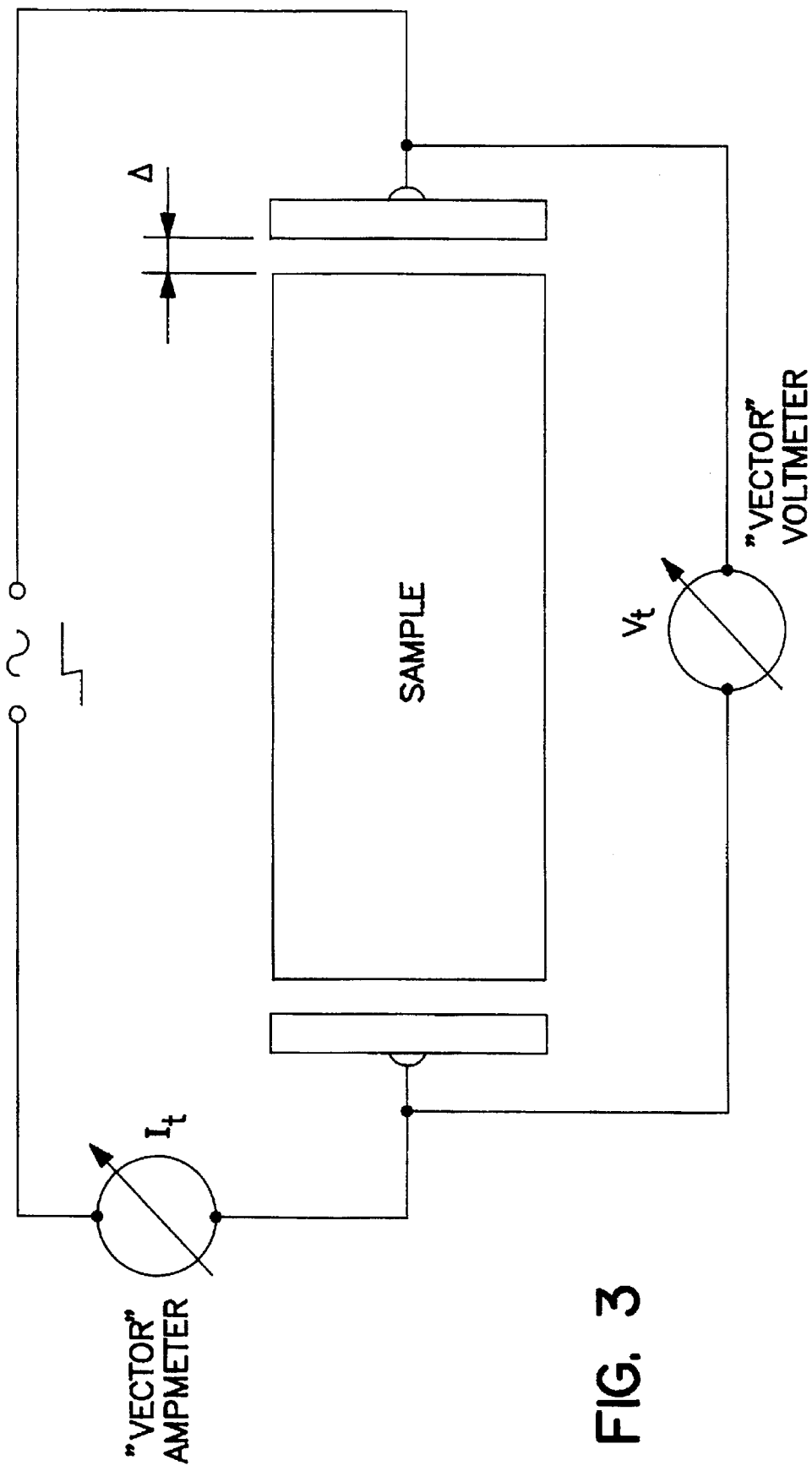
FIG. 3 is a schematic diagram of the experimental measuring arrangement which may be utilized to measure the electrical complex impedance $\tilde{Z}$ (ω) of the series combination—sample bulk, sample depletion regions and sample electrical constant regions (sample surface-metal electrode interface). (Definition of the measurement method)

A typical electrical measurement arrangement is shown schematically in FIG. 3. In the preferred embodiment of the present invention a sinusoidal voltage from the voltage source is applied across the sample (voltage input) and its amplitude is measured by a "vector" voltmeter. The amplitude and the phase shift (relative to the voltage input) of the output current (electrical current measured in the external electrical circuit) is measured by a "vector" ammeter and the ratio of the in-phase and out-of-phase component of the current output to the voltage input then defines the complex electrical admittance $\tilde{Y}(\omega)$ of the system under investigation (system being defined as sample+electrodes+external electrical leads).

Another quantity that characterizes the electrical response of the system under investigation is the complex electrical impedance of the system defined as $\tilde{Z}(\omega) = 1/\tilde{Y}(\omega)$.

The direct experimental determination of the $\tilde{Z}(\omega)$ is accomplished in practice most conveniently by various types of low frequency ($\omega \leq 1.10^{10}$ Hz) impedance a.c. bridges consisting of a voltage source with a variable frequency f ($\omega = 2\Pi f$), preferably with a range of 1 mHz through 10 GHz, "vector" voltmeter, "vector" ammeter and some additional circuitry to yield the function $\tilde{Z}(\omega)$ at various frequencies of the input sinusoidal voltage. All these components form elements of a single measurement unit shown schematically in FIG. 2a and FIG. 2b.

The Stage 3 of the present invention does not depend on any particular way of the measurement of the electrical response of the system under investigation but relates to a process consisting of the measurement of the electrical response of the system and its subsequent representation in the frequency domain by the complex electrical impedance (admittance) $\tilde{Z}(\omega)$ ($\tilde{Y}(\omega)$). This representation is not (strictly) necessary and other representations of the electrical response of the system under investigation, such as for example the complex dielectric constant $\epsilon(\omega)$, the complex electrical conductivity $\sigma(\omega)$, the complex electrical modulus $\tilde{M}(\omega)$ and/or various variations of the electrical response functions in the real time domain, are all of course possible. The $\tilde{Z}(\omega)$ ($\tilde{Y}(\omega)$) representation of the electrical response of the system is preferred for the reasons of clarity of the physical arguments behind the analysis of the electrical response data and because the numerical values of these functions at various frequencies have a very definite physical meaning in relation to the four electrical material parameters $\Delta\mu^{ch}\epsilon$, N and $\mu$ that are to be extracted from such an analysis.

Within the necessary experimental range of frequencies f (1 mHz–10 GHz) will these numeric values fall within the following typical ranges for most of studied semiconductors/insulators:

the real part of impedance in the range from 0.00t ohm to $10^{14}$ ohm. the imaginary part of admittance divided by $\omega$ from $10^{-14}$ Farad to $10^{-2}$ Farad.

Stage 4

Method of Analysis (calculation of the electrical material parameters $\Delta\mu^{ch}$, $\epsilon$, N an $\mu$ of a material under investigation).

Introduction

It is at stage 4 that the known physical theories and their mathematical formulation are applied to a specific technical problem, namely the problem of the electrical characterization of semiconducting and/or insulating materials in general ("research" configuration of the present invention) and in a more specific application, the problem or the electrical characterization of semiconductor wafers ("on-line quality control" configuration of the present invention).

The discovery aspect of the present invention can be summarized in two major points:

Firstly the discovery of a direct link (that can be formulated simply and clearly through mathematical equations and/or expressions) between the full theoretical analysis of the electrical response of a material, including the depletion regions and material surface-metal electrode interface regions and the experimentally observable electrical response function $\tilde{Z}(\omega)$ of the material (where the function $\tilde{Z}(\omega)$ describes the dependence of the complex electrical impedance of the material on the frequency of the applied external voltage input).

Secondly the discovery of a possibility of extracting the four electrical material parameters $\Delta\mu^{hu\ ch}$, $\epsilon$, N and $\mu$ of the material (and/or their combinations) when the depletion and material surface-metal electrode interface regions are included in such a theoretical analysis.

The invention itself is then embodied in the application of this discovery aspect to the technical problem of characterizing the electrical properties of semiconducting/insulating materials and semiconductor wafers through the determination of the four electrical material parameters $\Delta\mu^{ch}$, $\epsilon$, N and $\mu$ using the above mentioned method of analysis of the experimentally observed function $\tilde{Z}(\omega)$. One of the claims of the present invention will be therefore the use of the present invention to determine one, two, three, four and/or any combination of the four electrical material parameters to characterize electrically a piece of a material.

Because of the importance of the Stage 4 of the present invention a more detailed description of this stage will now be given.

Firstly, the definition of the problem will be presented.

Secondly, the description of the essential parts of the theory behind the full theoretical analysis of the electrical response of a real material (material with depletion regions, surface and material surface-metal electrode interface regions) will follow.

Thirdly, the various possible approximations and the corresponding solutions will be described and the link between the governing equations (and the corresponding solutions thereof) and the experimentally observable response function $\tilde{Z}(\omega)$ will be pointed out.

Fourthly the various methods of calculating the numerical values of the four electrical material parameters $\Delta\mu^{ch}$, $\epsilon$, N and $\mu$ will be described and the validity of the method of analysis of the present invention will be demonstrated on a set of experimental results obtained by the use of the present invention on a number of monocrystalline and polycrystalline silicon samples of both types (n-type and p-type) and with varying degrees of doping.

These results (the obtained numerical values of the four electrical material parameters $\Delta\mu^{ch}$, N and $\mu$) will be then contrasted in the final Table 2 with the results for the same four electrical material parameters obtained either on the same samples by the other experimental methods or by comparing the obtained values with those in the literature and/or in Physical Tables of material constants (4).

Definition of the problem.

Referring to FIGS. 2a, 2b and 3 the measured electrical response $\tilde{Z}(\omega)$ is due to the electrical response of the sample (bulk region, depletion regions and the surface-metal electrode interface regions), the electrical response of the contacting, conductive medium (FIG. 2b), the electrical response of the metal electrodes (FIGS. 2a and 2b), the electrical response of the electrical contacts (FIGS. 2a and 2b) and the electrical response of the external electrical leads (FIGS. 2a and 2b) connecting the sample configuration within a given sample environment to the external measurement circuit.

In order to obtain the electrical response function $\tilde{Z}_s(\omega)$ of the sample alone, it is therefore necessary to subtract from the total electrical response function $\tilde{Z}_{T\!oT}(\omega)$ of the total system the electrical response from all the unwanted elements of the system (contacting, conductive medium (if present), metal electrodes, electrical contacts and the external electrical leads.

This subtraction is in principle easy since the elements of the system are connected in series so that the total electrical response function $\tilde{Z}_{T\!oT}(\omega)$ of the system is the sum of the complex electrical impedances of the individual elements of the system. Provided that the electrical impedances $\tilde{Z}_i(\omega)$ of the individual elements of the system are known (this can be rather difficult to achieve in practice), this subtraction can be performed.

In the preferred embodiment of the present invention, the effect of $\tilde{Z}_i(\omega)$ of the elements of the system on the resulting total electrical response function $\tilde{Z}_{T\!oT}(\omega)$ is minimized, so that to a very good degree of precision (typically better than 1% accuracy) these effects can be neglected and the measured total electrical response function $\tilde{Z}_{T\!oT}(\omega)$ of the system represents the true electrical response of the sample $\tilde{Z}_s(\omega)$.

Having extracted the electrical response function $\tilde{Z}_s(\omega)$ of the sample from the experimentally observed $\tilde{Z}_{T\!oT}(\omega)$ (if modifications to the preferred embodiment of the present invention are used), the next step is to subject this function to the theoretical analysis embodied in the present invention.

The application of this analysis then results in the possibility of the determination of the numerical values for the four electrical material parameters $\Delta\mu^{ch}$, $\epsilon$, N and $\mu$ (and/or their combinations such as for example the specific resistivity of the bulk region of the material) that characterize the electrical properties of the material (semiconductor, insulator, semoconductor wafer etc.)

The results of the present analysis can be summarized very schematically as follows:

By including depletion regions and the surface (and/or material surface-metal electrode interface) regions of the material under investigation in the full analysis of the electrical response of the sample (rather than to try to avoid it at all costs, as has been the case up till now), the analysis method of the present invention shows that the form or the values of $\tilde{Z}_s(\omega)$ in various frequency regions and/or at various frequencies are related directly to the four electrical material parameters $\Delta\mu^{ch}$, $\epsilon$, N and $\mu$ of the material.

This means for example that under appropriate experimental conditions the value of the real part of the $\tilde{Z}_s(\omega)$ at high frequencies is related directly to the bulk resistivity $\rho$ of the material ($\rho$: $1/N\cdot e\cdot\mu$), while the imaginary part of the $\tilde{Y}_s(\omega)$ divided by $\omega$ is related directly to the bulk dielectric constant $\epsilon$.

Similarly, at low frequencies both the real part of $\tilde{Z}_s(\omega)$ and the imaginary part of $\tilde{Y}_s(\omega)$ divided by $\omega$ are directly related to the parameters $\Delta\mu^{ch}$ and N.

Furthermore, by looking at the form of $\tilde{Z}_s(\omega)$ (and/or $\tilde{Y}_s(\omega)$) in the appropriate frequency regions it is possible to establish the type of the majority charge carriers and whether the electrical transport within the material is due to only one kind of mobile electrical charges (electrons or holes) or whether both mobile electrical charges (electrons and holes) contribute significantly.

Finally, it is possible for the first time to study quantitatively the bulk region, the depletion regions and the surfaces (and/or material surface-metal electrode interface regions) of the material under investigation independently and separately by measuring (studying) the electrical response function $\tilde{Z}_s(\omega)$ in various frequency regions.

Description of the theory behind the analysis method (the elements off)

a) Electrical response in solids at classical frequencies

Figure 4A:
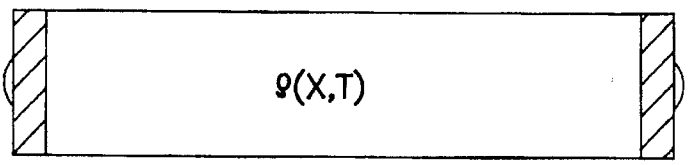
FIG. 4a, 4b, 4c, 4d, 4e is a schematic diagram of the passive R,C electrical network model that approximates the electrical response of the material (bulk, depletion and electrical contact regions) to a small external electrical field input signal. (Definition of the approximative R,C model for the electrical response function $\tilde{Z}_s(\omega)$ of the sample)
Figure 4B:
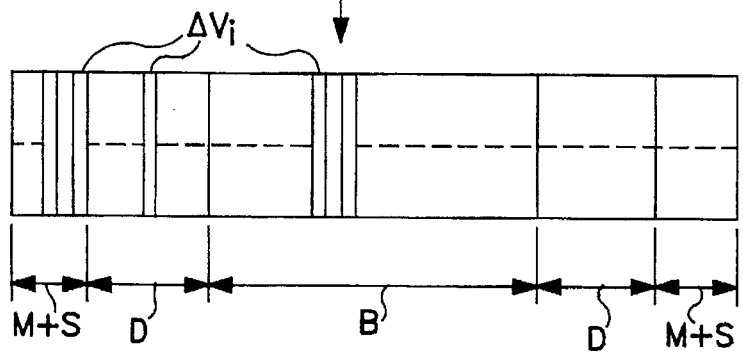
Figure 4C:
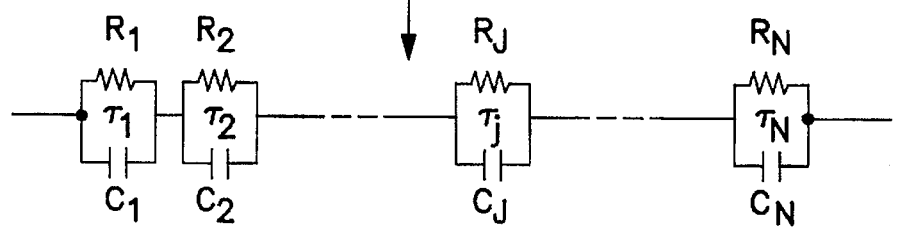

A new analysis of the electrical response of a macroscopic solid state system to an arbitrary electrical voltage input indicates that with a small sinusoidal voltage input within the classical frequency range ($\omega < 10^{10}$ Hz), the electrical response in a solid state system mirrors first of all the static, spatial distribution of the mobile charge carrier density through the local electrical conductivity relaxation time $\tau_\sigma(x)=\epsilon(x)/\sigma_{D.C.}(x)$ ($\epsilon(x)$ is the local dielectric constant, $\sigma_{D.C.}(x)$ is the local d.c. electrical conductivity) (see FIGS. 4b and 4c).

This enables any system, inclusive the depletion regions and the electrical contact regions of a material to be modelled by a simple, passive R,C electrical network, where each of the network elements has a very direct physical meaning.

Furthermore, since the electrical conductivity relaxation time is more or less the only relevant characteristic time of the problem, the regions of the sample with different $\tau_\sigma$ will respond at different characteristic frequencies that are directly related to $\tau_\sigma$. In this way it is therefore possible to study for example the bulk, the depletion and the electrical contact regions separately by studying the electrical response of the sample (system) in different frequency regions.

b) Mathematical formulation

The macroscopic electrical response of a medium (characterized by a dielectric constant $\epsilon$ and the electrical mobility $\mu$) at classical frequencies is described fully by classical electrodynamics (two of Maxwell equations), the constitutive equation defining the total local electrical current, the initial condition for the total, electrical charge density $\rho(x,t)$ spatial distribution and by the boundary condition defining the charge transport across the boundaries.

Within the classical range of frequencies ($\omega < 10^{10}$ Hz) the dielectric constant $\epsilon$ of the material and the electrical mobility $\mu$ of the mobile electrical charges within the (bulk of) the material can be both considered as time independent (possible slow polarisations neglected in the first approximation).

In one dimension (the appropriate experimental arrangement) and when both types of the mobile charge carriers (electrons at $E_c$ and holes at $E_v$—see FIG. 1) contribute to the transport, the defining equations can be re-cast into a set of coupled, non-linear parabolic equations for each type of the mobile charge carrier particle density:

$$\frac{\partial n_e(E_c,x,t)}{\partial t} = +\mu_e \cdot \frac{\partial \vec{E}(x,t)}{\partial x} \cdot n_e(E_c,x,t) + \quad (1)$$

$$\mu_e \cdot \vec{E}(x,t) \cdot \frac{\partial n_e(E_c,x,t)}{\partial x} +$$

$$+\frac{\mu_e \cdot k \cdot T}{|e|} \cdot \frac{\partial^2 n_e(E_c,x,t)}{\partial x^2} + G_e - R_e$$

$$\frac{\partial n_h(E_v,x,t)}{\partial t} = -\mu_h \cdot \frac{\partial \vec{E}(x,t)}{\partial x} \cdot n_h(E_v,x,t) -$$

$$\mu_h \cdot \vec{E}(x,t) \cdot \frac{\partial n_h(E_v,x,t)}{\partial x} +$$

$$+\frac{\mu_h \cdot k \cdot T}{|e|} \cdot \frac{\partial^2 n_h(E_v,x,t)}{\partial x^2} + G_h - R_h$$

$$\frac{\partial N^+_{LOC}(E_i,x,t)}{\partial t} = -[(E.R.)_i - (C.R.)_i]_{E_i}$$

$$\frac{\partial N^-_{LOC}(E_j,x,t)}{\partial t} = -[(E.R.)_j - (C.R.)_j]_{E_j}$$

where $$div\, \vec{E}(x,t) = \frac{\rho(x,t)}{\epsilon} \quad (2)$$

$$\rho(x,t) = |e| \cdot \left[ -n_e(E_c,x,t) + n_h(E_v,x,t) + \sum_i N^+_{LOC}(E_i,x,t) - \right.$$

$$\left. -\sum_j N^-_{LOC}(E_j,x,t) \right]$$

$$\vec{E}(x,t) = \vec{E}_{INT}(x,t) + \vec{E}_{EXT}(t)$$

The constitutive equation defining the total local electrical current has the form $$\vec{j}(x,t) = |e| \cdot [\mu_e \cdot n_e(E_c,x,t) + \mu_h \cdot n_h(E_v,x,t)] \cdot \vec{E}(x,t) - \quad (3)$$

$$-\frac{k \cdot T}{|e|} \cdot \left[ -\mu_e \cdot \frac{\partial n_e(E_c,x,t)}{\partial x} + \mu_h \cdot \frac{\partial n_h(E_v,x,t)}{\partial x} \right]$$

and the boundary condition for $\rho(x,t)$ is defined through the relation $$\frac{\partial \rho(x,t)}{\partial t}\bigg|_{x=0,L} = -\frac{\partial j(x,t)}{\partial x}\bigg|_{x=0,L} \quad (4)$$

Here $\mu_e$ and $\mu_h$ are the electrical mobilities of the electrons at $E_c$ and of the holes at $E_v$ respectively, $\epsilon$ is the dielectric constant of the material, k is Boltzmann constant, T is the absolute temperature and $|e|$ is the elemental electrical charge.

The quantities $n_c(E_c,x,t)$, $n_h(E_v,x,t)$, $\vec{E}(x,t)$ and $\rho(x,t)$ are the particle number densities of the respective mobile charge carriers, the local electrical field and the local, total charge density respectively. $N_{i,LOC}^+(E_i,x,t)$ and $N_{j,LOC}^-(E_j,x,t)$ are the local particle number densities of charged, localised energy levels $E_i$ and $E_j$ within the energy band gap $E_g$.

$(E.R.)_i$, $(C.R.)_i$, $(E.R.)_j$ and $(C.R.)_j$ are their respective emission and capture rates and finally $G_e$, $R_e$ and $G_h$, $R_h$ are the generation and recombination rates for mobile electrons at $E_c$ and holes at $E_v$ respectively.

c) Results—Dynamical solution

A set of the governing equations (1) and (2) together with the appropriate initial and boundary conditions for $n_c(E_c,x,t)$, $n_h(Ev,x,t)$ (mobile electron and hole particle densities), $N^{30}{}_{i,LOC}(E_i,x,t)$ and $N^-{}_{j,LOC}(E_j,x,t)$ (localized positive and negative charge particle number densities) then determine the space-time evolution of the total charge density $\rho(x,t)$ and therefore also the electrical current flowing in the external circuit in a response to a given applied voltage input, thereby defining the electrical complex impedance of the sample $\tilde{Z}_s(\omega)$.

d) Results—Long time, static limit

For times $t \gg 0$ ($t \to \infty$) and with no external applied field, the set of the governing equations leads to the formation of the (majority) mobile charge carrier depleted regions near the surfaces if the boundary condition reflects the finite difference in the chemical potential across the boundary at time $t=0$. In this case the space-time evolution of the total charge density $\rho(x,t)$ will approach the equilibrium, time independent distribution as the time goes to "infinity" $t_o \to \infty$. This distribution is also a solution of the static Poisson equation to which the problem reduces in this long time, static limit.

e) Results—Small signal approximation and the static R,C network solution to the problem of the electrical response One of the major results of the present dynamical analysis of the electrical response in solids at classical frequencies is concerned with a small input signal approximation.

When the external applied voltage is sufficiently small, the equilibrium, spatially non-homogeneous distribution of the mobile charge carrier particle densities will not be disturbed by the applied external electrical field and it can be shown that the electrical response of the entire system (sample) under these conditions is identical to a response from simple, parallel R,C electrical elements, connected in series. Contrary to the usual passive R,C network models of various junctions, interfaces and semiconductor—insulator—metal structures, the electrical elements in the present static R,C network have a very direct physical meaning and are all interrelated.

According to the result of the present analysis, the sample is simply divided into a number of volume elements (see FIGS. 4a, 4b and 4c), the actual number depending on the required precision with which the electrical response is required. Each volume element $\Delta V_j$ is characterized by its electrical resistance $R_j$ (in-phase component of the response; usually dissipation of the external field energy through finite electrical mobility $\mu$ of the material) and by its geometrical capacitance $Cj$ (out-of phase component of the response; fast polarisation through finite dielectric constant $\epsilon$ of the material).

The solution of the Poisson equation in the long time, static limit determines the spatial distribution of the electrical mobile charge density within the sample and therefore also the electrical resistance of each of the volume elements $\Delta V(x_j)$. The geometrical dimensions of each volume element then determine its characteristic geometrical capacitance.

By defining R's and C's for all the volume elements comprising the sample (bulk region), the depletion regions and surface-metal electrode interface regions) one has determined also the total electrical complex impedance of the sample $\tilde{Z}_s(\omega)$ which is simply the sum of the impedance of the individual volume elements.

As can be seen from FIG. 4c each of the volume elements has got its own characteristic electrical conductivity relaxation time $\tau_j$ and the "visibility" of the depletion regions, bulk region and the contact regions of the sample in the xperimentally observed $Z_s(\omega)$ becomes now obvious. Depending on the frequency of the applied external electrical field (applied external voltage input), the different parts of the sample will be (or will not be) able to respond.

In the long time, static approximation therefore, the measurement of the electrical response $(\tilde{Z}_s(\omega))$ at different frequencies is directly related to the equilibrium spatial distribution of the mobile electrical charge particle density in the different parts of the sample.

Identification of the link (correlation) between the theoretical analysis of the electrical response and the experientally observed electrical response function $\tilde{Z}_s(\omega)$.

It is the discovery of a direct correlation between the space-time evolution of the total charge density $\rho(x,t)$ within the sample and the experimentally observable electrical impedance of the sample $\tilde{Z}_s(\omega)$ together with the solutions for $\rho(x,t)$ (either a dynamical solution obtained by solving the whole set of governing equations numerically or a static solution obtained by solving the static, time independent Poisson equation with corresponding reticulation of the sample into the sum of the volume elements, each characterized by its own impedance), that constitutes the discovery aspect in the theoretical analysis embodied in the present invention.

The use of this discovery aspect to characterize the electrical properties of semiconducting/insulating materials and semiconducting wafers through the extraction of the four electrical material parameters $\Delta\mu^{ch}$, $\epsilon$, N and $\mu$ (either some of them, all of them or some combination of them) using this method of analysis (together with the other stages described) then constitutes the present invention.

Calculation of the four electrical material parameters $\Delta\mu^{ch}$, $\epsilon$, N and $\mu$ of the material under investigation.

Depending on the particular material under investigation, the calculation of the electrical material parameters from the experimentally observed electrical response function (complex electrical impedance) of the sample $\tilde{Z}_s(\omega)$ can proceed (can be performed) at three possible levels described in the foregoing paragraphs. These levels will now be described in more detail in order of increasing complexity.

Level 1—"Hat" model approximation.

It turns out that within the long time limit static approximation a further simplification can be employed in the static R,C network analysis of the electrical response of the sample that makes the determination of the four electrical material parameters $\Delta\mu^{ch}$, $\epsilon$, N and $\mu$ even more direct. If the (characteristic) frequency regions corresponding to the response from the material surface-metal electrode interface regions, from the depletion regions and from the bulk region of the sample are all well separated, it is possible to lump all the volume elements of the bulk region together and do the same for the depletion regions and the sample surface-metal electrode interfaces. The electrical response of the sample is then represented by a very simple static R,C network consisting now of only three R,C elements representing in turn the electrical response from the sample surface-metal electrode interfaces (time constant $\tau_{M+S}$), the electrical response from the depletion regions (time constant $\tau_D$) and the electrical response from the bulk of the sample (time constant $\tau_B$). This representation (named here as "Hat" model approximation) of the electrical response of the sample shown in FIG. 4d is sufficiently precise only in case when the characteristic time constants of the respective regions of the sample are well separated ($\tau_{M+S} > \tau_D > \tau_B$).

Figure 4D:
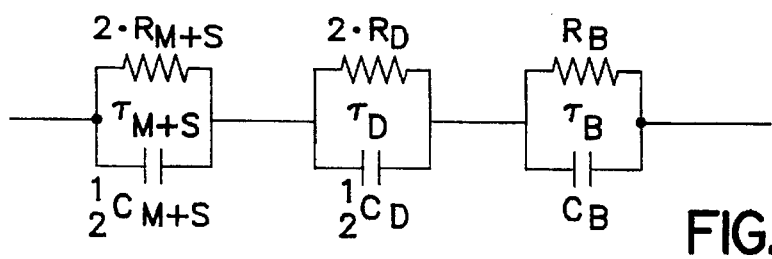

The "Hat" model reticulation of the sample shown in FIG. 4d enables one to write down analytic expressions for the four quantities $R_D$, $C_D$, $R_B$ and $C_B$ that can be identified in the "raw" experimental data of the measured $\tilde{Z}_s(\omega)$ of the sample.

Figure 5A:
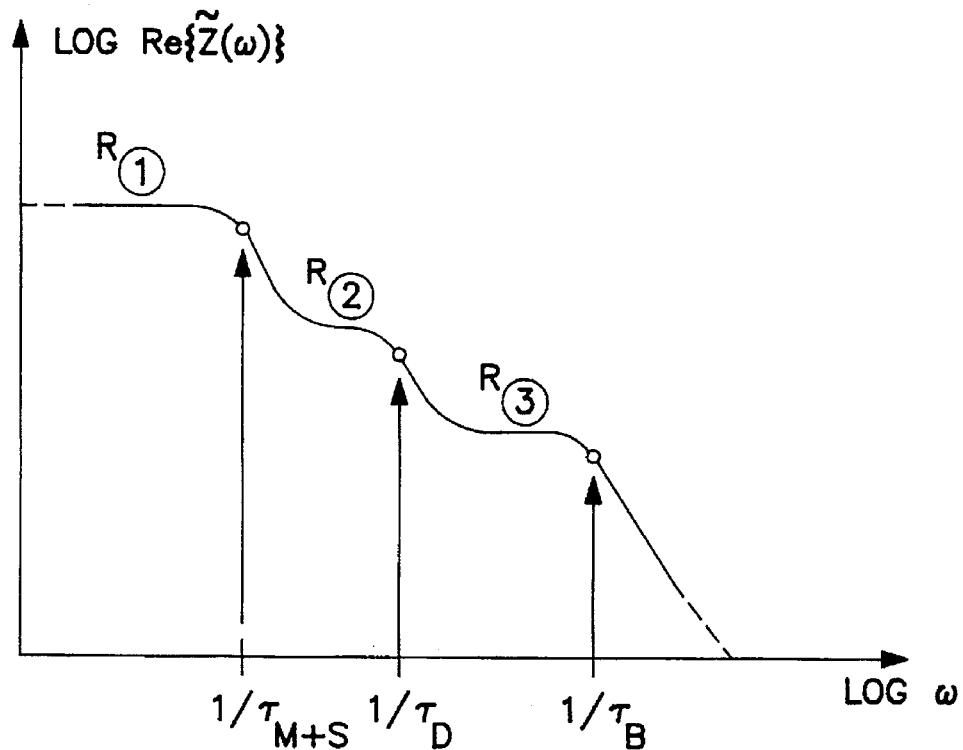
FIG. 5 is a schematic graphical representation of the electrical response function Z (ω), (Y(ω)) of the material sample modelled by FIG. 4d, comprising the bulk, the depletion and electrical contact regions of the sample.
Figure 5B:
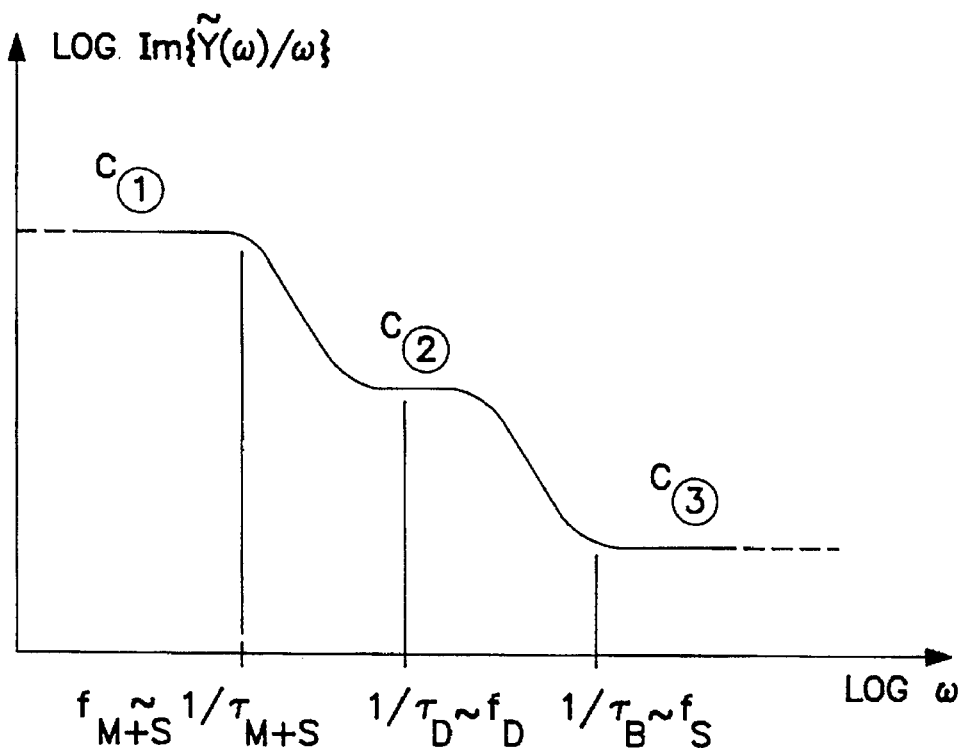

The expected frequency dependence of $\tilde{Z}_s(\omega)$ for a sample represented by the equivalent electrical circuit of FIG. 4d is shown in FIG. 5. For clarity purpose the real part of $\tilde{Z}_s(\omega)$ (dimension Ohm) and imaginary part of $\tilde{Y}_s(\omega)/\omega$ (dimension Farad) are displayed. The flat parts of the curves denoted by symbols $R_{(2)}$, $R_{(3)}$, $C_{(2)}$ and $C_{(3)}$ are directly related to $R_D$, $R_B$, $C_D$ and $C_B$ through algebraic relations $$R_{(1)} = 2 \cdot R_{M+S}(T) \quad C_{(1)} = \frac{1}{2} \cdot C_{M+S}(T) \tag{5}$$

$$R_{(2)} = 2 \cdot R_D(T) \quad C_{(2)} = \frac{1}{2} \cdot C_D(T)$$

$$R_{(3)} = R_B \quad C_{(3)} = C_B(T)$$

which in turn are defined in terms of the four electrical material parameters $\Delta\mu^{ch}$, $\epsilon$, N and $\mu$ of the material under investigation.

For the case of a typical semiconductor/insulator with a band gap $E_g$ and with one-particle effective density of states $N_c$ (conduction band) and $N_v$ (valence band) the defining expressions are $$R_B = \frac{1}{|e| \cdot \mu(T) \cdot N} \cdot \frac{L - 2 \cdot W_D(T)}{A_r} \tag{6}$$

$$C_B = \epsilon_o \cdot \epsilon_r \cdot \frac{A_r}{L - 2 \cdot W_D(T)}$$

$$R_D = \frac{e^{\frac{E_g}{2 \cdot kT}}}{|e| \cdot \sqrt{N_c \cdot N_v \cdot \mu_e(T) \cdot \mu_h(T)}} \cdot$$

$$\frac{\frac{k \cdot T}{2 \cdot \Delta\mu^{ch}(T)} \cdot W_D(T)}{A_r} \cdot \left[ \arctan\left(\frac{z}{\sqrt{c}}\right) \right]_u^1$$

$$C_D = \epsilon_o \cdot \epsilon_r \cdot \frac{A_r}{W_D(T)}$$

where $$u = e^{\frac{\Delta\mu^{ch}}{kT}}$$

$$W_D(T) = \sqrt{\frac{2 \cdot \epsilon \cdot \Delta\mu^{ch}(T)}{N \cdot e^2}}$$

$$c = \left(\frac{N_c}{N_v}\right) \cdot \left(\frac{1}{P_2}\right) \cdot e^{\frac{(-E_g + 2\alpha)}{kT}} \text{ and } \alpha = E_o^P + \Delta\mu^{ch}(T) \text{ (n-type)}$$

$$c = \left(\frac{N_v}{N_c}\right) \cdot \left(\frac{P_2}{1}\right) \cdot e^{\frac{(+E_g - 2\alpha)}{kT}} \text{ and } \alpha = E_o^P - \Delta\mu^{ch}(T) \text{ (p-type)}$$

-continued $$P_2 = \frac{\mu_h(T)}{\mu_e(T)}$$

The quantities appearing in the analytical expressions have the following meaning:

μ(T)—electrical mobility of the mobile, majority el. charge carriers $\mu_e(T)$—electrical mobility of the electrons at $E_c$ $\mu_h(T)$—electrical mobility of the holes at $E_v$ N—mobile, majority el. charge carriers particle number density L—total length of the sample $W_D(T)$—depletion width of the sample $A_r$—total, active area of the sample $\epsilon_o \cdot \epsilon_r = \epsilon$—dielectric constant of the sample (silicon)

$E_g$—energy gap of the material $\Delta\mu^{ch}(T)$—difference in the chemical potential $N_c$, $N_v$—one-particle effective densities of states in the conduction ($E_c$) and valence ($E_v$) bands respectively

|e|—elemental electrical charge k—Boltzmann constant

T—absolute temperature $E_o^P$—Energy difference between the top of the valence band and the electrochemical potential at the surface of the sample $E_o^m$—Energy difference between the bottom of the conduction band and the electrochemical potential at the surface of the sample Z—variable in the function arctg having integration limits u and 1.0

Considering now the four electrical material parameters $\Delta\mu^{ch}$, $\epsilon$, N and $\mu$ as four unknown constants difined by four independent equations, it ts clear that a unique solution exists. It can found iteratively by first assuming some definite values (starting values) for $\Delta\mu^{ch}$, $\epsilon$, N and $\mu$, then calculating the quanties $R_{(2)}$, $R_{(3)}$, $C_{(2)}$, $C_{(3)}$ and comparing the result with the observed values of $R_{(2)}$, $R_{(3)}$, $C_{(2)}$ and $C_{(3)}$. The next step in the iteration procedure coonsists in changing the starting values for $\Delta\mu^{ch}$, $\epsilon$, n, $\mu$ and repeating the whole process until the required precision (agreement between the calculated and measured values of $R_{(2)}$, $R_{(3)}$, $C_{(2)}$ and $C_{(3)}$ is obtained. The fitting procedure is so simple that it can be done by hand and does not required computer. In these cases where the ratio of the electrical mobilities $P_2 = \mu_n/\mu_e$ is also considered as an unknown parameter, a combination of the measurements on both n-type and p-type samples is needed in order to object a unique solution.

Level 2

Static Approximation Using the Solution of the Poisson Equation

Figure 4E:
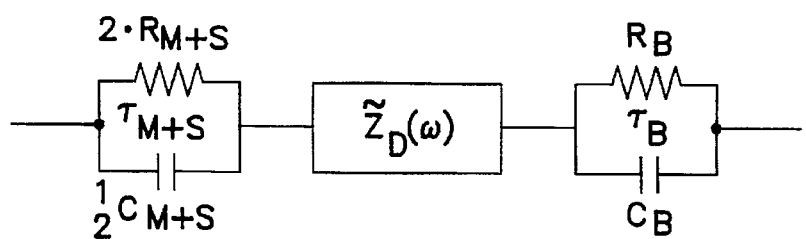

When a fit to the experimentally observed electrical reponse function $\tilde{Z}_s(\omega)$ of the sample over the entire frequency domain measured in the experiment is required for higher precision the individual levels $R_{(2)}$, $R_{(3)}$, $C_{(2)}$ and $C_{(3)}$ can not be easily identified in the raw experimental data $\tilde{Z}_s(\omega)$, the static R,C network analysis of the electrical response of the sample involves the reticulation of the sample as shown in FIG. 4e. Here the depletion region volume elements have not been lumped together but rather the resistances of the individual volume elements within the depletion region have been determined through the solution of the Poisson equation for the total local charge density $\rho(x,t \to \infty)$ assuming simple parabolic bands (parabolic band approximation—see FIG. 1). The electrical impedance of the depletion region can then be calculated analytically leading to the expression (both electrons and holes contributing to the electrical transport) for $\tilde{Z}_D(\omega)$ of the form $$\tilde{Z}_D(\omega) = \frac{Z_0}{\sqrt{1+\omega^2\tau_1^2}} \cdot \left[ \arctan\left( \frac{\frac{\beta'}{\tau_1} \cdot \sqrt{1+\omega^2\tau_1^2}}{(1+i\cdot\omega\tau)} \right) \right] \quad (7)$$

$$Z_0 = \frac{\frac{E_q}{e^{2 \cdot kT}}}{|e| \cdot \sqrt{N_c \cdot N_v \cdot \mu_e \cdot \mu_h}} \cdot \frac{\frac{k \cdot T}{2 \cdot \Delta\mu^{ch}} \cdot W_D(T)}{A_r}$$

$$\tau_1 = \tau_0 \cdot e^{\frac{E_q}{2 \cdot kT}} \qquad \tau_0 = \frac{e_o \cdot e_r}{2 \cdot |e| \cdot \sqrt{N_c \cdot N_v \cdot \mu_e \cdot \mu_h}}$$

$$\beta' = \beta_0 \cdot \left( e^{\frac{\Delta\mu^{ch}}{kT}} - 1 \right)$$

$$\tau = \beta_0 \cdot \left( e^{\frac{\Delta\mu^{ch}}{kT}} + 1 \right) \qquad \beta_0 = \frac{\tau_0}{\frac{1}{a} \cdot e^{\frac{(-E_o^P + \Delta\mu^{ch})}{kT}} + a \cdot e^{\frac{E_o^n}{kT}}}$$

where $$a = \sqrt{\frac{N_c \cdot \mu_e}{N_v \cdot \mu_h}}, \qquad W_D(T) = \sqrt{\frac{2 \cdot \epsilon \cdot \Delta\mu^{ch}(T)}{N \cdot e^2}}$$

and where $\mu_e$ (T)—electrical mobility of the electrons at $E_c$ $\mu_h$ (T)—electrical mobility of the holes at $E_v$ $N_c$, $N_v$—one-particle effective densities of states in the conduction ($E_c$) and valence ($E_v$) bands $\epsilon_0 \cdot \epsilon_r = \epsilon$—dielectric constant of the sample $|e|$—elemental electrical charge $E_g$—energy gap of the material k—Boltzmann constant T—absolute temperature $W_D$ (T)—depletion width of the sample $\Delta\mu^{ch}$ (T)—difference in the chemical patential N—mobile, majority electrical charges particle number density $A_r$—total, active area of the sample.

In order to extract the four electrical material parameters $\Delta\mu^{ch}$, $\epsilon$, N and $\mu$ of the material under investigation, the same iterative procedure as before is used only now the fit can be best performed by a computer using the four electrical material parameters as free fitting parameters. The computer is used mainly for the purpose of time economy, since in principle the calculation can be done by hand due to the fact that the solution for the $\tilde{Z}_S(\omega)$ is analytical also in this case. If the analytical expressions for the interface element (material surface-metal electrode interface region) are not known, the fit to the experimentally observed $\tilde{Z}_D(\omega)$ is performed using $R_{M+S}$ and $C_{M+S}$ as two extra phenomenological free fitting parameters. In case of silicon though the analytical expressions for the interface elements $R_{M+S}$, $C_{M+S}$ do exist as will be demonstrated in the experimental verification of the present invention. The effect of $R_{M+S}$ and $C_{M+S}$ beyond the frequency $1/\tau_{M+S}$ (FIG. 5) is small, the form of the response function $\tilde{Z}_S(\omega)$ in this frequency region being determined mainly by $\tilde{Z}_D(\omega)$ and the known bulk element $\tilde{Z}_B(\omega)$ (elements $R_B$ and $C_B$).

Level 3

Dynamical Solution

When a complete analysis of the electrical response of the material is required either for reasons of highest precision or when the form of the $\tilde{Z}_S(\omega)$ is more complex and the detailed analysis of the boundaries of the sample (interface element $R_{M+S}$ and $C_{M+S}$) is needed, the full dynamical solution of the problem has to be undertaken numerically. This situation corresponds to FIG. 4a and no reticulation of the sample into individual volume elements is performed (reticulation is not relevant in this case since the reticulation of the sample and the static R,C network analysis of the electrical response of the sample is the approximative solution representation of the full dynamical solution of the problem).

Besides the governing (transport) equations for the local charge density $\rho(x,t)$ space-time evolution describing the electrical response of the sample to the external voltage input, it is necessary to define (to model) the initial condition for the $\rho(x,t)$ and the appropriate boundary conditions (transport of the electrical charge across the boundaries—surface of the sample).

Once the initial and the boundary conditions are defined the set of the governing equations for the space-time evolution of the total, local charge density $\rho(x,t)$ is solved numerically with some starting values of the four electrical material parameters $\Delta\mu^{ch}$, $\epsilon$, N and $\mu$. The resulting calculated electrical response function $\tilde{Z}_{CAL}(\omega)$ of the sample is then compared with the experimentally observed complex electrical impedance $\tilde{Z}_{EXP}(\omega)$ and the whole process undergoes iterations until the required agreement between $\tilde{Z}_{CAL}(\omega)$ and $\tilde{Z}_{EXP}(\omega)$ is obtained, leading to the final values of the four electrical material parameters $\Delta\mu^{ch}$, $\epsilon$, N and $\mu$ characterizing the electrical properties of the material under investigation.

At this level of solution the computer is essential since the problem of calculating $\tilde{Z}_{CAL}(\omega)$ can be done only numerically.

Verification of the Validity of the Present Invention

Experimental Examples

The first set of experimental tests has been performed with pure, monocrystalline silicon samples of both types (n-type and p-type) with varying degree of doping using either evaporated thick gold film or a conductive silver paint as metal electrode material.

Figure 6A:
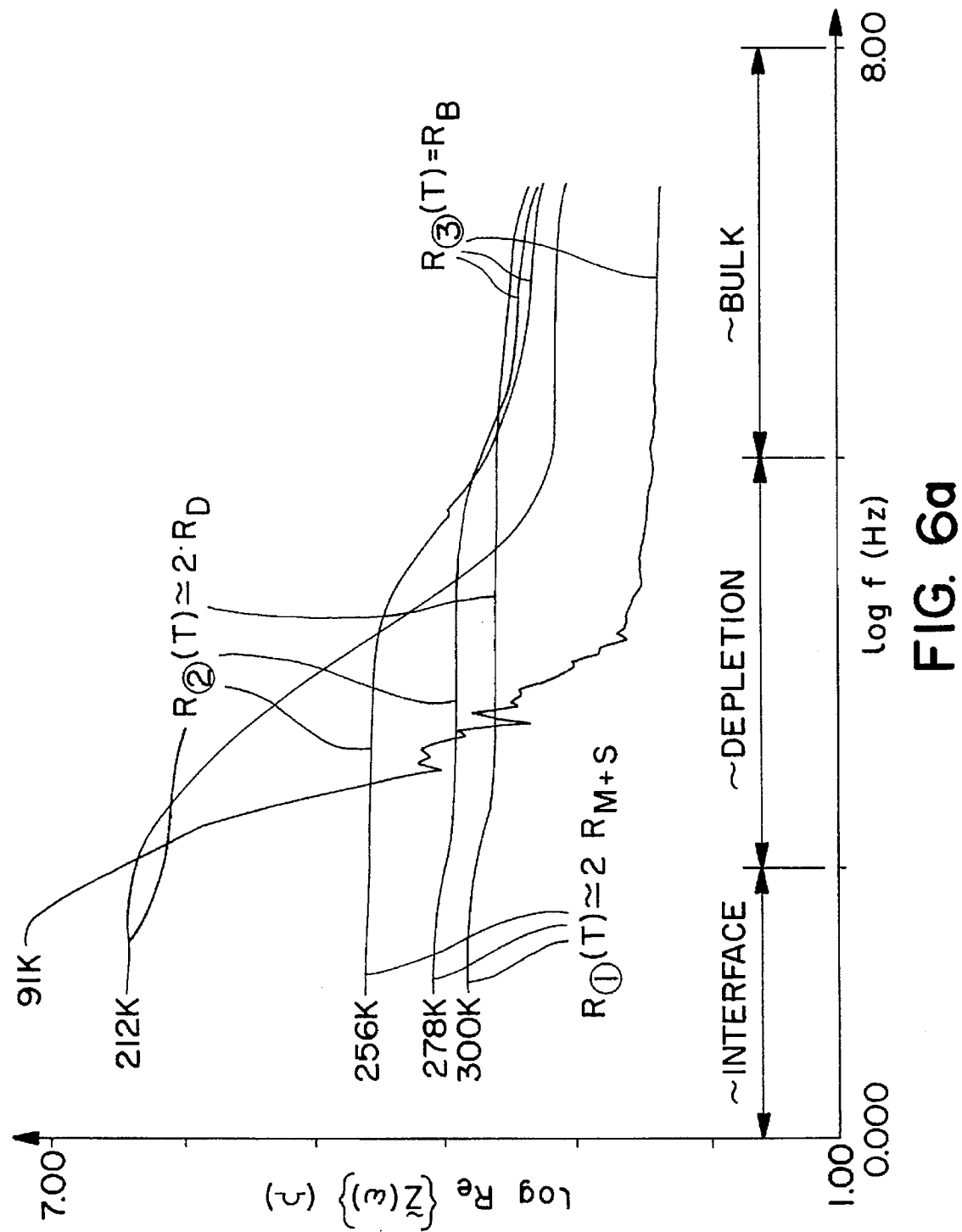
FIG. 6a, 6b show Example 1; the experimentally observed electrical response of the sample 1 (ultra pure silicon monocrystal as a function of temperature T. (ω=2π·f)
Figure 6B:
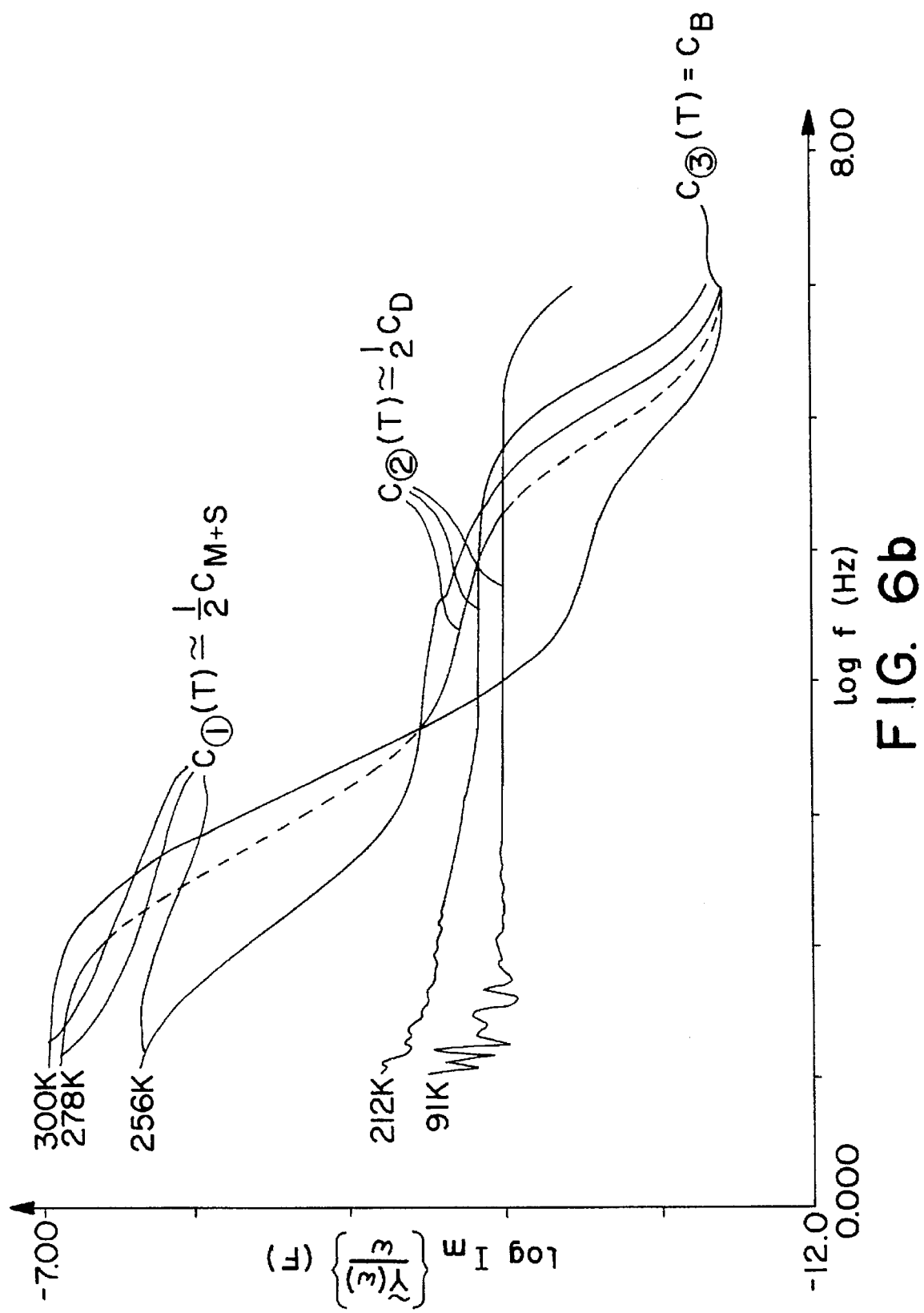

Typical raw experimental results of the electrical response in these samples are shown in FIGS. 6a and 6b where log {Re $(\tilde{Z}_S(\omega))$} and log {Im $(\tilde{Y}_S(\omega)/\omega)$} are plotted versus log of the measurement frequency for a number of different temperatures.

The verification of the validity of the present invention has been proved in two different ways. The first is demonstrated in the Table 2 where the numerical values of the four electrical material parameters $\Delta\mu^{ch}$, $\epsilon$, N and $\mu$ are compared either with the literature values ($\Delta\mu^{ch}$, $\epsilon$ and $\mu$) or with the values obtained by using 4PDCR and FTIR/FTIPL experimental methods on the same samples.

A high degree of agreement has been obtained (to within 5%) limited only by the precision of the determination of the geometrical dimensions of the sample.

As is apparent from the Table 2 the values of the four electrical material parameters determined by the "New" EIS method (present invention) are more precise than the values for these parameters obtained by the other methods or obtained from the literature.

The second way of verifying (testing) the validity of the present invention was the use of the temperature variations of the experimentally observed $Z_S$ ($\omega$) of the samples (temperature being used as a known parameter).

The four electrical material parameters have been extracted from the measured $\tilde{Z}_S$ ($\omega$) at a given temperature by fitting these four parameters at this single temperature. The form and the numerical values of the $\tilde{Z}_S$ ($\omega$, T) were then calculated at other chosen temperatures (the temperature dependence of the $\tilde{Z}_S$ ($\omega$, T) is known—it is also one of the results of the theoretical analysis of the electrical response embodied in the present invention). The calculated values for $\tilde{Z}_S$ ($\omega$, T) were then compared with the observed $\tilde{Z}_S$ ($\omega$, T) at chosen temperatures over the entire frequency range measured in the experiment. A complete agreement has been found proving beyond reasonable doubt the validity of the present invention.

The second set of experimental tests has been performed with pure, polycrystalline silicon of high purity, without the prior knowledge of the type of the majority, mobile electrical charge carriers. Evaporated, thick gold film or conductive silver paint were used as metal electrode material.

The typical raw experimental results of the electrical response in these samples, are shown in FIGS. 7a and 7b, where log {Re[$\tilde{Z}_s$ ($\omega$)]} and log {Im[$\tilde{Y}_s$ ($\omega$)]} are plotted versus log of the measurement frequency for a number of different temperatures.

Using the present invention it was possible to identify the electrical topology of silicon grains in polycrystalline silicon samples (FIG. 8a), the nature of the electrical transport in polycrystalline silicon, the electrical characteristics of the individual grains/grain boundaries (FIGS. 8b, 8c) and the concentration N of the majority mobile charge carriers (electrical purity) in these polycrystalline silicon samples.

With N as free parameter an extremely good numerical fit to the raw experimental data (FIGS. 7a, 7b) at different temperatures was obtained, using the static R,C electrical network analysis (FIGS. 8a, 8b, 8c) of the present invention. The best numerical value for the quantity N was found to be approximately $6 \cdot 10^{18}$ m$^{-3}$ indicating an extreme purity of the starting polycrystaline silicon material.

Comparison between the new EIS experimental method according to the invention and the prior C-V (Quasistatic, d.c. voltage bias dependent Capacitance measurement) and DLTS (Deep Level Transient Spectroscopy) experimental methods.

At this stage it is appropriate to compare at least qualitatively the new EIS experimental method according to the present invention with two other experimental methods and variations thereof that are used today for the electrical characterization of semiconducting materials. It is claimed that they are capable of yielding the values of N and/or N(x) (the density of the majority mobile charge carriers; C-V experimental methods) and the energy position and the density of the deep localized energy levels within the gap of a measured semiconductor (the quantities $N^+_{i,LOC}$ ($E_i$, x) and $N^-_{j,LOC}$ ($E_j$, x) in equation system (1); DLTS experimental methods).

Both of these methods attempt to measure the depletion capacitance $C_D$ (equation (5) and FIG. (5)) and its changes either with an externally applied d.c voltage bias $V_{d.c.}^{BIAS}$ (C-V methods) or with temperature T (DLTS methods).

However, they both suffer from a fundamental physical flaw in that the measuring frequency e at which the wanted capacitance $C_D$ of the system under investigation is to be measured is chosen arbitrarily. A quick inspection of FIG. 5 shows that if this arbitrarily chosen frequency used by the two methods does not fall within a narrow range around $f_D$ (flat part of $C_{\textcircled{2}}$)) both methods will yield incorrect results (the measured capacitance not related to $C_D$) with deduced electrical material parameters that bear no relation to their true values. This is particularly so for the higher resistivity semiconductors and insulators where the usual frequency used (1MHz) semiconductors and insulators where the usual frequency used (1MHz) would yield a measurement of the bulk capacitance $C_B$ rather than that of the depletion capacitance $C_D$ (equation (5) and FIG. 5).

It is also evident that when the measuring frequency is chosen correctly (close to the flat part of the $C_2$—FIG. 5), both methods are represented by a single point on the measured electrical impedance curve $\tilde{Z}$ ($\omega$) (Im($\tilde{Y}(\omega)/\omega$)) of the present invention. In such case they therefore represent a measurement of the level $C_2$ (FIG. 5) as a function of the d.c. voltage bias and/or as a function of the temperature T.

The knowledge and the proper analysis of the full $\tilde{Z}$ (9) curve (present invention) is however essential in order to decide about the validity of the C-V and DLTS results.

It should also be pointed out that the EIS experimental method according to the present invention measures N and/or N(x) directly through the measurement of the $\tilde{Z}$ ($\omega$) over the entire relevant frequency range. One of the major results of the present invention is namely the discovery of one to one correspondanco between the measuring frequency $\omega$ and the spatial co-ordinate x. The measurement of $\tilde{Z}$ ($\omega$) at frequency $\omega_i$ is a measure of the density of the mobile electrical charges N(x) at point $x_i$. This is a result of the solution of the Poisson equation and it is valid under small signal approximation—the usual condition of the EIS experiment.

In conclusion it should be stressed again that the C-V and DLTS type of measurements are embodied automatically (as a single point in the $\tilde{Z}$ ($\omega$) curves) in the EIS experimental method according to the present invention. No dedicated C-V or DLTS apparatus is necessary and by measuring $\tilde{Z}$ (9) in the whole frequency range there is a quarantee that no errors arise from incorrectly chosen measuring frequency.

It is therefore desired that the invention not be limited to the preferred embodiment (FIGS. 1 to 8) and it is intended to cover in the appended claims all such variations or modifications as fall within the scope of the present invention.

REFERENCES (1) S. M. Sze (1981) "Physics of Semiconductor Devices" (John Wiley & Sons)

(2) E. H. Nicollian and I. R. Brews (1982) "MOS (Metal Oxide Semiconductor) Physics and Technology" (John Wiley & Sons)

(3) I. Ross MacDonald editor (1987) "Impedance Spectroscopy" (John Wiley & Sons)

(4) R. C. Weast editor (1974) "Handbook of Chemistry and Physics" (CRC Press, Cleveland, Ohio)

TABLE 1

| EXP Method | ρ(ΩM) | ε(FM$^{-1}$) | μ(M$^2$v$^{-1}$s$^{-1}$) | N(M$^{-3}$) | Δμ$^{ch}$(eV) | Comment |
|---|---|---|---|---|---|---|
| Standard EIS |  | Yes |  |  |  | Only if properly analysed |
| Standard EIS | Yes |  |  |  |  | Only if properly analysed |
| 4 PDCR | Yes |  |  |  |  | Only for ρ ≦ 1kΩ cm |
| 4 PDCR |  |  | Yes | Yes |  | Only in combination with Hall Effect |
| He |  |  | Yes | Yes |  | and for ρ ≦ 1kΩ cm (unusable for Glasses) |
| FTIR |  |  |  | Yes |  | Only in monocrystalline semiconductors |
| FTIPL |  |  |  | Yes |  | Measurements at liq.He temperatures) |
| FTIR |  | Yes |  |  |  | Only if μ known |
| FTIPL |  | Yes |  |  |  | (Measurements at lig.He temperatures) |
| TOF |  |  | Yes |  |  | Problems with thin resistive samples |
| CP |  |  |  |  | Yes | Large Discrepancies |
| TEE |  |  |  |  | Yes | among the measured values |
| PEE |  |  |  |  | Yes |  |
| MAR | Yes | Yes |  |  |  | Only if properly Analysed |
| "NEW" EIS | Yes | Yes | Yes | Yes | Yes |  |

Four Probe d.c. electrical resistivity (4PDCR)
Standard Electrical Impedance Spectroscopy (EIS)
Hall Effect (HE)
Fast Fourier Transform Infrared Photoluminescence (FTIPL)
Fast Fourier Transform Infrared spectroscopy (FTIR)
Contact Potential (CP)
Thermal Electron Emission (TEE)
Electrical Time - of - Flight (TOF)
Photo-electrical Electron Emission (PEE)
Microwave Absorption-Reflection (MAR)

TABLE 2

| SAMPLE n. | MAJORITY CARRIERS | ELEC- TRODES | EIS N(M$^{-3}$) | FTIR/FTIPL N(M$^{-3}$) | EIS ρ(Ωcm) | 4PDCR ρ(Ωcm) | EIS ε/ε$_o$ | Literature ε/ε$_o$ | EIS Δμ$^{ch}$(eV) | Literature Δμ$^{ch}$(eV) |
|---|---|---|---|---|---|---|---|---|---|---|
| n.1 | n | Au | 1.90·10$^{17}$ | 2.98·10$^{17}$ |  |  | 12.0 | 11.9 | 0.6 ± 0.05 |  |
| n.94 | n | Au | 4.02·10$^{17}$ | 2.98·10$^{17}$ |  |  | 12.0 | 11.9 | 0.6 |  |
| TOP3 | n | Au |  |  | 782 | 855 | 12.0 | 11.9 | 0.6 |  |
| TOP3 | n | Ag |  |  | 782 | 855 | 12.0 | 11.9 | 0.6 |  |
| n.19 | p | Au | 6.63·10$^{17}$ | 7.44·10$^{17}$ |  |  | 12.0 | 11.9 | 0.4 ± 0.10 | 0.8 + 0.4 |
| n.19 | p | Ag | 6.63·10$^{17}$ | 7.44·10$^{17}$ |  |  | 12.0 | 11.9 | 0.4 |  |
| n.92 | p | Au | 7.55·10$^{17}$ | 10.5·10$^{17}$ |  |  | 12.0 | 11.9 | 0.4 |  |
| TOP1 | p | Au |  |  | 8741 | 11480 | 12.0 | 11.9 | 0.4 |  |
| TOP1 | p | Ag |  |  | 8741 | 11480 | 12.0 | 11.9 | 0.4 |  |

We claim:

1. A method for determining characteristic electrical properties of semi-conducting materials wherein the time or frequency dependent electrical impedance Z(t) or $\tilde{Z}(\omega)$, respectively, or admittance Y(t) or $\tilde{Y}(\omega)$, respectively, is measured, comprising the steps of establishing a finite, positive (n-type material) or negative (p-type material) difference in the chemical potential between the inner and the surface of the material or between the inner of the material and the metal electrode—material surface interface layer, thereby causing the formation of depletion regions near the electrical contacts and by using the effect of this established difference in the chemical potential on the measured electrical impedance or admittance the step of determining from this measured electrical impedance or admittance one, more or all of the following electrical parameters f the material:

the difference Δμ$^{ch}$ in chemical potential, the dielectric constant ε, the density N of majority mobile charge carriers, the density N$_{min}$ of minority mobile charge carriers, the electrical mobility μ of majority mobile charge carriers, the electrical mobility μ$_{min}$ of minority mobile charge carriers, the emission and capture rates E.R and C.R. respectively, for mobile positive and negative charge carriers characterizing the effect of surface and bulk localized states within the band gap (Eg), when they are present, on the electrical transport and the measured electrical impedance, whereby the determination of the electrical parameters of the material is carried out by solving a system of equations for the total charge density ρ(x,t) consisting of the mobile negative and positive charge densities and localized negative and positive charge densities in the material supplemented with initial and boundary conditions, where the space-time development of ρ(x,t) determines the electric current running in the external circuit in response to the applied electric voltage thereby defining the electrical complex impedance $\tilde{Z}_s(\omega)$ of the material.

2. The method according to claim 1, wherein the electrical parameters of the metal electrode-material surface interface layer such as the emission and capture cross sections $\sigma_e$ and $\sigma_c$ of the interface layer for the mobile positive and negative charge carriers are determined from the measured electrical impedance by means of the initial and boundary conditions for $\rho(x,t)$.

3. The method according to claim 1, in which the interface layer is a Si-SiO$_2$-metal electrode interface layer, wherein the electrical elements $R_{M+S}$ and $C_{M+S}$ of the interface layer are determined by means of the expressions:

$$R_{M+S} = \frac{e^b 1 - (c_1 - k^{-T})^2}{c_1 \cdot |e| \cdot A^* \cdot T^2} \cdot \frac{1}{A_r} \cdot \frac{\sin(\pi \cdot c_1 - k^{-T})}{(\pi \cdot c_1 \cdot k \cdot T)} \cdot e^{\frac{\Delta E_z}{kT}}$$

$$C_{M+S} = \epsilon_{SiO_2} \cdot \frac{d_{SiO_2}}{A_r}$$

where $$c_1 = \frac{\alpha}{2} \cdot \frac{d_{SiO_2}}{\sqrt{\Delta E_1}}, \quad \alpha = 4 \cdot \pi \cdot \frac{\sqrt{2 \cdot m}}{h} \text{ and } b_1 = c \cdot \sqrt{\Delta E_1} \cdot d_{SiO_2}$$

and wherein the quantities appearing in the analytical expressions have the following meaning:

$\epsilon SiO_2$—dielectric constant of the silicon dioxide
$dSiO_2$—thickless of the native silicon dioxide layer
$A_r$—total area of the sample
A Richardson constant $\Delta E_1$—quantum runnelling barrier height
m—electron rest mass
h—Pfanck's constant
k—Boltzmann's constant
T—absolute temperature
$\Delta E_2$—activation energy
$|E|$—absolute value of elemental charge.

4. The method according to claim 1, wherein that the electrical parameters of the material are determined from the following expressions for capacitance and resistance of the inner of the material and the depletion region thereof, respectively:

$$R_B = \frac{1}{|e| \cdot \mu(T) \cdot N} \cdot \frac{L - 2 \cdot W_D(T)}{A_r}$$

$$C_B = \epsilon_o \cdot \epsilon_r \cdot \frac{A_r}{L - 2 \cdot W_D(T)}$$

$$R_D = \frac{e^{\frac{E_\Sigma}{1-kT}}}{|e| \cdot \sqrt{N_c \cdot N_v \cdot \mu_e(T) \cdot \mu_h(T)}} \cdot \frac{\frac{k \cdot T}{2 \cdot \Delta \mu^{ch}(T)} \cdot W_D(T)}{A_r} \cdot \left[ \arctan\left(\frac{z}{\sqrt{c}}\right) \right]_u^1$$

$$C_D = \epsilon_o \cdot \epsilon_r \cdot \frac{A_r}{W_D(T)}$$

where $$u = e^{\frac{\Delta \mu^{ch}}{k \cdot T}}$$

$$W_D(T) = \sqrt{\frac{2 \cdot \epsilon \cdot \Delta \mu^{ch}(T)}{N \cdot e^2}}$$

$$c = \left(\frac{N_c}{N_v}\right) \cdot \left(\frac{1}{P_2}\right) \cdot e^{\frac{(-E_q - 2\alpha)}{kT}} \text{ and } \alpha = E_o^P + \Delta\mu^{ch}(T) \text{ (n-type)}$$

$$c = \left(\frac{N_v}{N_c}\right) \cdot \left(\frac{P_2}{1}\right) \cdot e^{\frac{(+E_q - 2\alpha)}{kT}} \text{ and } \alpha = E_o^P - \Delta\mu^{ch}(T) \text{ (p-type)}$$

$$P_2 = \frac{\mu_h(T)}{\mu_e(T)}$$

which are identifiable as levels on the measured electrical impedance curve $\tilde{Z}(\omega)$, and where the quantities appearing in the analytical expressions have the following meaning:

$\mu(T)$—electrical mobility of The mobile, majority el. charge carriers
$\mu_e(T)$—electrical mobility of the electrons at $E_c$
$\mu_n(T)$—electrical mobility of the holes at $E_v$
N—mobile, majority el. charge carriers particle number density
L—total length of the sample
$W_o(T)$—depletion width of the sample
$A_r$—total, active area of the sample
$C_o \cdot \epsilon_r = C$—dielectric constant of the sample
$\epsilon_q$—energy gap of the material
$\Delta\mu^{ch}(T)$—difference in the chemical potential
$N_c$, $N_v$—one particle effective densities of states in the conduction ($E_c$) and valence ($E_v$) bands respectively
$|E|$—elemental electrical charge
k—Boltzmann constant
T—absolute temperature
$E_O^P$—Energy difference between the top of the valence band and the electrochemical potential at the surface of the sample
$E_O^M$—Energy difference between the bottom of the conduction band and the electrochemical potential at the surface of the sample
Z—variable in the function arctg having integration limits u and 1.0.

5. The method according to claim 1, wherein the electrical parameters of the material are determined from the capacitance and resistance of the interface layer and the inner of the material and the electrical impedance of the depletion region by the following expressions:

$$R_{M+S} = \frac{e^b 1 \cdot (c_1 \cdot k \cdot T)^2}{c_1 \cdot |e| \cdot A^* \cdot T^2} \cdot \frac{1}{A_r} \cdot \frac{\sin(\pi \cdot c_1 \cdot k \cdot T)}{(\pi \cdot c_1 \cdot k \cdot T)} \cdot e^{\frac{\Delta E_z}{kT}}$$

$$C_{M+S} = \epsilon_{SiO_2} \cdot \frac{d_{SiO_2}}{A_r}$$

where $$c_1 = \frac{\alpha}{2} \cdot \frac{d_{SiO_2}}{\sqrt{\Delta E_1}}, \quad \alpha = 4 \cdot \pi \cdot \frac{\sqrt{2 \cdot m}}{h} \text{ and } b_1 = c \cdot \sqrt{\Delta E_1} \cdot d_{SiO_2}$$

and wherein the quantities appearing in the analytical expressions have the following meaning:

$\epsilon SiO_2$—dielectric constant of the silicon dioxide
$dSiO_2$—thickness of the native silicon dioxide layer
$A_r$—total area of the sample
A Richardson constant
$\Delta E_1$—quantum runnelling barrier height
m—electron rest mass
h—Planck's constant k—Bolzmann's constant
T—absolute temperature
$\Delta E_2$—activation energy
|E|—absolute value of elemental charge, $$\tilde{Z}_D(\omega) = \frac{Z_0}{\sqrt{1+\omega^2\tau_1^2}} \cdot \left[\arctan\left(\frac{\frac{\beta'}{\tau_1} \cdot \sqrt{1+\omega^2\tau_1^2}}{(1+i\cdot\omega\tau)}\right)\right] \quad (7)$$

$$Z_0 = \frac{e^{\frac{E_q}{2 \cdot kT}}}{|e| \cdot \sqrt{N_c \cdot N_v \cdot \mu_e \cdot \mu_h}} \cdot \frac{\frac{k \cdot T}{2 \cdot \Delta\mu^{ch}} \cdot W_D(T)}{A_r}$$

$$\tau_1 = \tau_0 \cdot e^{\frac{E_q}{2 \cdot kT}} \qquad \tau_0 = \frac{e_o \cdot e_r}{2 \cdot |e| \cdot \sqrt{N_c \cdot N_v \cdot \mu_e \cdot \mu_h}}$$

$$\beta' = \beta_0 \cdot \left(e^{\frac{\Delta\mu^{ch}}{kT}} - 1\right)$$

$$\tau = \beta_0 \cdot \left(e^{\frac{\Delta\mu^{ch}}{kT}} + 1\right) \qquad \beta_0 = \frac{\tau_0}{\frac{1}{a} \cdot e^{\frac{(-E_o^P + \Delta\mu^{ch})}{kT}} + a \cdot e^{\frac{E_o^n}{kT}}}$$

where $$a = \sqrt{\frac{N_c \cdot \mu_e}{N_v \cdot \mu_h}}, \qquad W_D(T) = \sqrt{\frac{2 \cdot \epsilon \cdot \Delta\mu^{ch}(T)}{N \cdot e^2}}$$

and where $\mu_e(T)$—electrical mobility of the electrons at $E_c$
$\mu_n(T)$—electrical mobility of the holes at $E_v$
$N_c$, $N_v$—one-particle effective densities of states in the conduction ($E_c$) and valence ($E_v$) bands
$\epsilon_o \cdot \epsilon_r = \epsilon$—dielectric constant of the sample
|e|—elemental electrical charge
$E_g$—energy gap of the material
k—Boltzmann constant
T—absolute temperature
$W_D(T)$—depletion width of the sample
$\Delta\mu^{ch}(T)$—difference in the chemical potential
N—mobile, majority electrical charges particle number density
$A_r$—total, active area of the sample,
and $$R_B = \frac{1}{|e| \cdot \mu(T) \cdot N} \cdot \frac{L - 2 \cdot W_D(T)}{A_r}$$

$$C_B = \epsilon_o \cdot \epsilon_r \cdot \frac{A_r}{L - 2 \cdot W_D(T)}$$

where $$W_D(T) = \sqrt{\frac{2 \cdot \epsilon \cdot \Delta\mu^{ch}(T)}{N \cdot e^2}}$$

|e|—elemental electrical change
$\mu(T)$—electrical mobility of the mobile, majority electrical charge carriers,
N—mobile electrical charge carriers particle number density
$W_D(T)$—depletion width of the sample
$\Delta\mu^{ch}(T)$—difference in chemical potential $\epsilon_o \cdot \epsilon_r = \epsilon$—dielectric constant of the sample
L—total length of the sample
Ar—total active area of the sample
and
where the values of $C_{M+S}$ and $R_{M+S}$ are identifiable as levels on the measured impedance curve $\tilde{Z}(\omega)$ if such levels are present.

6. The method according to claim 1, wherein for the "research" experimental set-up the material is deposited semipermanently on the metal electrodes or vice versa.

7. The method according to claim 1, wherein for "quality control" set-up the metal electrodes are brought into contact with the surface of the material via an electrically conducting medium which ensures a well-defined electrical contact area on the specimen, such as an elastic or flowable material which may be brought into and out of engagement with one or both surfaces of the material.

8. The method according to claim 7, wherein the measurement is repeated in points distributed throughout the area of the specimen for mapping the electrical parameters of the material.

9. An apparatus for carrying out the method according to claim 1, comprising an external electrical circuit for measuring the time or frequency dependent electrical impedance $\tilde{Z}(t)$ or $\tilde{Z}(\omega)$ or admittance $Y(t)$ or $\tilde{Y}(\omega)$ of the material and means for electrically contacting the surface or surfaces of the material, means for providing a finite, positive (n-type material) or negative (p-type material) difference in the chemical potential between the inner and the surface of the material or between the inner of the material and the metal electrode—material surface interface layer, thereby causing the formation of depletion regions near the electrical contacts and means for determining from the measured electrical impedance or admittance one, more or all of the following electrical parameters of the material:

the difference $\Delta\mu^{ch}$ in chemical potential,
the dielectric constant $\epsilon$,
the density N of majority mobile charge carriers,
the density $N_{min}$ of minority mobile charge carriers,
the electrical mobility $\mu$ of majority mobile charge carriers,
the electrical mobility $\mu_{min}$ of minority mobile charge carriers,
the emission and capture rates E.R and C.R, respectively, of mobile positive and negative charge carriers characterizing the effect of surface and bulk localized states within the band gap, when they are present, on the electrical transport and the measured electrical impedance.

10. The apparatus according to claim 9, wherein it is arranged for measuring the electrical impedance/admittance in a frequency range from 1 mHz to 10 GHz (1000 s–0.10 ns) and with a real component of the impedance in the range from 0.001 ohm to $10^{14}$ ohm and an imaginary component of the admittance divided by the frequency $\omega$ in the range from $10^{-14}$ Farad to $10^{-2}$ Farad.

11. The apparatus according to claim 9, comprising a specimen support having a plurality of coaxial leads for connection to the specimen of the external electrical measurement circuit and means for controlling the temperature of the specimen.

12. The apparatus according to claim 9, comprising electrically conducting contact means providing for a well defined electrical contact area on the specimen and which are arranged for being brought into and out of engagement with one or both of the surfaces of the material, and control means for relatively adjusting the contact means and the specimen throughout the total area thereof.

* * * * *